(12) United States Patent
Yoshida et al.

(10) Patent No.: US 9,599,866 B2
(45) Date of Patent: Mar. 21, 2017

(54) ACTIVE MATRIX SUBSTRATE AND DISPLAY DEVICE

(71) Applicant: Sharp Kabushiki Kaisha, Osaka-shi, Osaka (JP)

(72) Inventors: Masahiro Yoshida, Osaka (JP); Isao Ogasawara, Osaka (JP)

(73) Assignee: Sharp Kabushiki Kaisha, Sakai (JP)

( * ) Notice: Subject to any disclaimer, the term of this patent is extended or adjusted under 35 U.S.C. 154(b) by 0 days.

(21) Appl. No.: 14/438,683

(22) PCT Filed: Nov. 1, 2013

(86) PCT No.: PCT/JP2013/079726
§ 371 (c)(1),
(2) Date: Apr. 27, 2015

(87) PCT Pub. No.: WO2014/073485
PCT Pub. Date: May 15, 2014

(65) Prior Publication Data
US 2015/0301389 A1    Oct. 22, 2015

(30) Foreign Application Priority Data

Nov. 8, 2012   (JP) ................... 2012-246029

(51) Int. Cl.
| | |
|---|---|
| *H01L 27/12* | (2006.01) |
| *H01L 27/32* | (2006.01) |
| *G02F 1/1345* | (2006.01) |
| *G02F 1/1362* | (2006.01) |
| *G02F 1/1368* | (2006.01) |

(52) U.S. Cl.
CPC ........ *G02F 1/13454* (2013.01); *G02F 1/1345* (2013.01); *G02F 1/1368* (2013.01); *G02F 1/136209* (2013.01); *G02F 1/136286* (2013.01); *H01L 27/1225* (2013.01); *G02F 2001/13456* (2013.01)

(58) Field of Classification Search
CPC .................................................... H01L 27/124
USPC ........................................................... 257/43
See application file for complete search history.

(56) References Cited

U.S. PATENT DOCUMENTS

| | | | | |
|---|---|---|---|---|
| 5,453,857 | A * | 9/1995 | Takahara | ............ H04N 5/7441 348/E5.141 |
| 2004/0008295 | A1 * | 1/2004 | Ueda | ................. H01L 29/78633 349/44 |
| 2008/0007667 | A1 | 1/2008 | Nakayama | |
| 2008/0251787 | A1 * | 10/2008 | Kim | ........................ H01L 22/32 257/48 |
| 2009/0174835 | A1 * | 7/2009 | Lee | ....................... G02F 1/1368 349/46 |

(Continued)

FOREIGN PATENT DOCUMENTS

JP     2008-015368 A     1/2008

*Primary Examiner* — Andy Huynh
*Assistant Examiner* — Sitaramarao S Yechuri
(74) *Attorney, Agent, or Firm* — Keating & Bennett, LLP

(57) ABSTRACT

On an active matrix substrate (5), metal electrodes (44) are provided below pixel electrodes (19). At least portions of a plurality of second thin-film transistors (second switching elements) (23b) are covered by light shielding films formed from the metal electrodes (44). The metal electrodes (light shielding films) (44) are covered by an interlayer insulating film (33) and an electrode film (CSa) of an auxiliary capacitance electrode (common electrode) (CS).

16 Claims, 20 Drawing Sheets

(56) References Cited

U.S. PATENT DOCUMENTS

2011/0018571 A1* 1/2011 Kim ............... G02F 1/1345
 324/760.02
2012/0268396 A1* 10/2012 Kim ............... G06F 3/0412
 345/173

* cited by examiner

ACTIVE MATRIX SUBSTRATE AND DISPLAY DEVICE

TECHNICAL FIELD

The present invention relates to an active matrix substrate including gate bus lines and data bus lines, and to a display apparatus incorporating the same.

BACKGROUND ART

In recent years, for example, liquid crystal display apparatuses are widely used in liquid crystal televisions, monitors, mobile telephones, and the like as flat panel displays that are advantageously thin and lightweight compared to conventional cathode ray tubes. In some known examples of such liquid crystal display apparatuses, a liquid crystal panel serving as a display panel incorporates an active matrix substrate on which a plurality of data bus lines (source wires) and a plurality of gate bus lines (scan wires) are arranged in a matrix pattern, and pixels are arranged in a matrix pattern as well. The pixels are in the vicinity of intersections between the data bus lines and the gate bus lines, and each pixel includes a switching element (first switching element), such as a thin-film transistor (TFT), and a pixel electrode connected to the switching element.

As is known in the art, in concert with downsized frames of liquid crystal display apparatuses, the aforementioned conventional active matrix substrate has inspection thin-film transistors (second switching elements), which are arranged in the vicinity of a portion on which a driver chip (IC chip) of a data driver (source driver) and/or a gate driver is mounted, for the purpose of inspecting the corresponding data bus lines or gate bus lines.

Furthermore, as described in, for example, the below-listed Patent Document 1, it has been suggested to provide a conventional active matrix substrate with a cover pattern that covers the aforementioned inspection thin-film transistors so as to alleviate damage to an inspection unit including the inspection thin-film transistors.

PRIOR ART DOCUMENTS

Patent Document

[Patent Document 1] JP 2008-15368A

DISCLOSURE OF INVENTION

Problem to be Solved by the Invention

However, on the aforementioned conventional active matrix substrate, the cover pattern (light shielding film) is formed in the topmost layer, and hence there is a possibility that the cover pattern is easily scratched. For example, a liquid crystal panel has a portion where an active matrix substrate is not covered by a counter substrate. In this portion, the counter substrate is generally removed in a dividing process performed prior to an inspection process. During the dividing process, in the portion where the counter substrate used to be placed before the removal, a cover pattern is easily scratched. Consequently, this conventional active matrix substrate has the problem that inspection thin-film transistors (second switching elements) cannot be protected appropriately. Especially, when the cover pattern is a light shielding film for inhibiting the generation of a leak current in the inspection thin-film transistors, the inspection precision may undesirably decrease. Furthermore, when detaching a mounted driver chip (reworking) due to the discovery of defects in the mounted driver chip, the cover pattern may undesirably be scratched.

It is possible to form an additional protection film for the cover pattern on this conventional active matrix substrate. This, however, undesirably complicates and expands the manufacturing processes of the active matrix substrate, resulting in a significant cost increase.

In view of the aforementioned problems, the present invention aims to provide a low-cost active matrix substrate that can easily protect second switching elements without expanding the manufacturing processes, as well as a display apparatus incorporating such an active matrix substrate.

Means for Solving Problem

In order to achieve the aforementioned aim, an active matrix substrate of the present invention includes: a base member; a gate bus line provided on the base member; a data bus line provided in a layer different from a layer of the gate bus line via an insulating film therebetween; a first switching element connected to the gate bus line and the data bus line; an interlayer insulating film provided so as to cover the first switching element, the interlayer insulating film having at least one layer; a pixel electrode connected to the first switching element; a common electrode that is made from transparent electrode material and is provided above or below the pixel electrode; a mounting terminal for supplying a signal from a driver to the gate bus line or the data bus line; a draw-out line connecting the mounting terminal and the gate bus line or the data bus line; a plurality of second switching elements that are each connected to a corresponding one of a plurality of draw-out lines constituting the draw-out line; and a first common wire connected in common to the plurality of second switching elements. A metal electrode is provided above or below the pixel electrode, at least a portion of each of the plurality of second switching elements is covered by a light shielding film formed from the metal electrode, and the light shielding film is covered by at least one of the interlayer insulating film and the common electrode.

On the active matrix substrate constructed in the foregoing manner, the metal electrode is provided above or below the pixel electrode. Also, at least a portion of each of the plurality of second switching elements is covered by the light shielding film formed from the metal electrode, and the light shielding film is covered by at least one of the interlayer insulating film and the common electrode. In this way, unlike the aforementioned conventional examples, the low-cost active matrix substrate that can easily protect the second switching elements can be constructed without expanding the manufacturing processes.

Furthermore, on the aforementioned active matrix substrate, it is preferable that each of the plurality of second switching elements be arranged outside an effective display region in which a plurality of gate bus lines constituting the gate bus line and a plurality of data bus lines constituting the data bus line are arranged in a matrix pattern, and in which a plurality of pixel electrodes constituting the pixel electrode are arranged in a matrix pattern.

In this case, operation processing, such as inspection processing and voltage application processing, can be performed appropriately with respect to the gate bus line or the data bus line using the second switching elements.

Furthermore, on the aforementioned active matrix substrate, it is preferable that the metal electrode be provided in a layer above or below the common electrode so as to be in direct contact with the common electrode.

In this case, as the metal electrode is provided in direct contact with the common electrode, a delay in a signal to the common electrode can be inhibited. Therefore, defective display, such as flickering and shadowing, can be inhibited.

Furthermore, the aforementioned active matrix substrate may include: a third switching element connected to an end portion of the gate bus line or the data bus line to which the mounting terminal is not connected; and a second common wire connected in common to a plurality of third switching elements constituting the third switching element.

In this case, the third switching elements and the second common wire are provided in a section where the aforementioned mounting terminal is not provided. Therefore, the configurations at the mounting terminal side, such as the configuration of the aforementioned first common wire, can be simplified, and the second switching elements can be installed more easily even if a region for mounting the driver is small (a driver IC chip is small).

Furthermore, on the aforementioned active matrix substrate, it is preferable that the second common wire be constituted by a plurality of second common wires, and a predetermined number of the third switching elements be connected to each of the plurality of second common wires.

In this case, operation processing, such as inspection processing and voltage application processing, can be performed per predetermined number of the aforementioned gate bus lines or data bus lines using the second common wires.

Furthermore, on the aforementioned active matrix substrate, it is preferable that the first common wire be constituted by a plurality of first common wires, and a predetermined number of the second switching elements be connected to each of the plurality of first common wires.

In this case, operation processing, such as inspection processing and voltage application processing, can be performed per predetermined number of the aforementioned gate bus lines or data bus lines using the first common wires.

Furthermore, it is preferable that, among the plurality of draw-out lines on the aforementioned active matrix substrate, one of two neighboring draw-out lines be formed from the same conductive layer as the gate bus line, and the other of the two neighboring draw-out lines be formed from the same conductive layer as the data bus line.

In this case, the occurrence of a short circuit and disconnection of the draw-out lines can be inhibited.

Furthermore, on the aforementioned active matrix substrate, it is preferable that the first common wire be constituted by a plurality of first common wires, two of the second switching elements that are connected respectively to two neighboring draw-out lines among the draw-out lines formed from the same conductive layer as the gate bus line be each connected to a different one of the first common wires, and two of the second switching elements that are connected respectively to two neighboring draw-out lines among the draw-out lines formed from the same conductive layer as the data bus line be each connected to a different one of the first common wires.

In this case, an inspection operation to check whether a short circuit has occurred can be easily performed by using the first common wires with respect to the draw-out lines formed from the same conductive layer as the gate bus line, as well as the draw-out lines formed from the same conductive layer as the data bus line.

Furthermore, on the aforementioned active matrix substrate, the draw-out lines may include a fan-out portion that is arranged at an angle with respect to a direction of arrangement of the gate bus line or the data bus line, and at least a portion of the first common wire and at least a portion of the second common wire may be arranged between the fan-out portion and the mounting terminal.

In this case, the draw-out lines formed in the fan-out portion can be inspected for a short circuit and disconnection, and the inspection precision can be kept high even when a frame region has been downsized or in the case of high definition.

Furthermore, the aforementioned active matrix substrate may be as follows: in the mounting terminal, an upper-layer terminal electrode and a lower-layer terminal electrode are connected via a terminal contact hole that is formed in at least one layer in the interlayer insulating film, the lower-layer terminal electrode being formed from at least one of the same conductive layer as the gate bus line and the same conductive layer as the data bus line; each of the plurality of second switching elements is arranged between the first common wire and the terminal contact hole; and the upper-layer terminal electrode is provided so as to cover at least a portion of each of the plurality of second switching elements.

In this case, the second switching elements can be easily installed even if the region for mounting the aforementioned driver is small.

Furthermore, on the aforementioned active matrix substrate, it is preferable that the mounting terminal include: a first lower-layer terminal electrode constituted by an end portion of a draw-out line formed from the same conductive layer as the gate bus line; and a second lower-layer terminal electrode that is constructed integrally with an electrode of the second switching elements and is formed from the same conductive layer as the data bus line, and it is also preferable that the first and second lower-layer terminal electrodes be connected to each other at the terminal contact hole.

In this case, cross-connection between the draw-out lines formed from the same conductive layer as the gate bus line and the electrode of the second switching elements formed from the same conductive layer as the data bus line can be implemented at the terminal contact hole. In this way, regions dedicated to such cross-connection need not be provided, and the dimension of the external shape of the active matrix substrate can be easily reduced.

Furthermore, on the aforementioned active matrix substrate, it is preferable that the mounting terminal include: a third lower-layer terminal electrode formed from the same conductive layer as the gate bus line; and a fourth lower-layer terminal electrode that is constituted by an end portion of a draw-out line formed from the same conductive layer as the data bus line and is constructed integrally with an electrode of the second switching elements, and it is also preferable that the third and fourth lower-layer terminal electrodes be connected to each other at the terminal contact hole.

In this case, all mounting terminals can be constructed in the same manner regardless of the configuration of the aforementioned draw-out lines, and an inspection for the state of the driver mounted on the mounting terminals can be easily carried out.

Furthermore, on the aforementioned active matrix substrate, it is preferable that the upper-layer terminal electrode be formed from the same conductive layer as the pixel electrode.

In this case, an active matrix substrate with a simple configuration can be easily constructed in simple manufacturing processes.

Furthermore, on the aforementioned active matrix substrate, it is preferable that an oxide semiconductor be used for both the first and second switching elements.

In this case, high-performance and compact switching elements can be easily constructed, and an inspection operation using the second switching elements can be performed with high precision.

A display apparatus of the present invention incorporates any one of the aforementioned active matrix substrates.

The display apparatus constructed in the foregoing manner incorporates the low-cost active matrix substrate that can easily protect the second switching elements without expanding the manufacturing processes. Therefore, the high-performance display apparatus can be easily constructed at low cost in simple manufacturing processes.

Effects of the Invention

The present invention makes it possible to provide a low-cost active matrix substrate that can easily protect second switching elements without expanding the manufacturing processes, as well as a display apparatus incorporating such an active matrix substrate.

DESCRIPTION OF THE INVENTION

Figure 1:
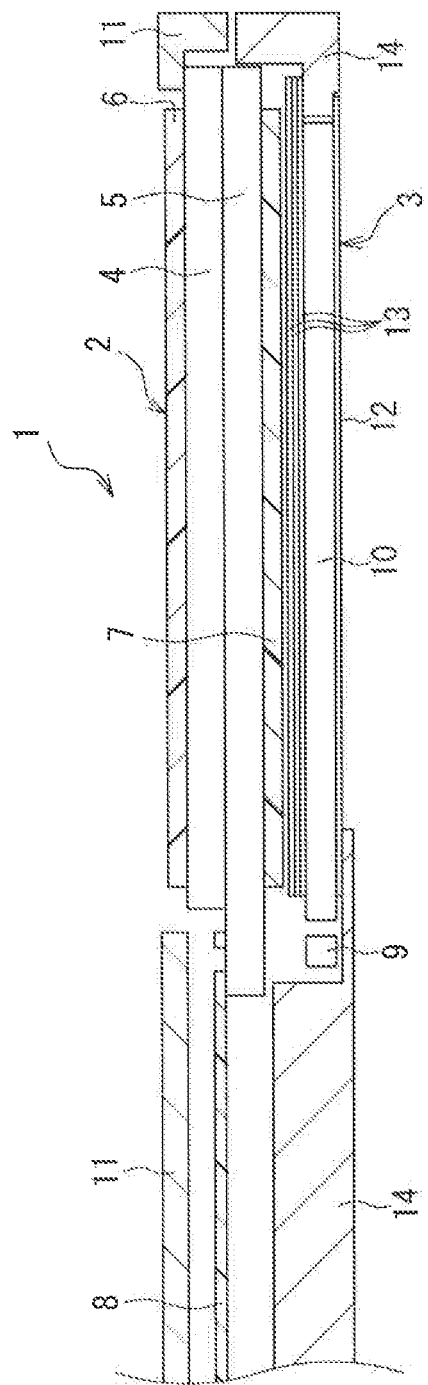
FIG. 1 is a diagram for describing a liquid crystal display apparatus incorporating an active matrix substrate according to a first embodiment of the present invention.

The following describes preferred embodiments of an active matrix substrate and a display apparatus of the present invention with reference to the drawings. It should be noted that the following description will be given using an example case in which the present invention is applied to a transmissive liquid crystal display apparatus. Furthermore, the dimensions of constituent elements in the drawings are not precise representations of the actual dimensions of the constituent elements, the actual dimensional ratios of the constituent elements, etc.

First Embodiment

FIG. 1 is a diagram for describing a liquid crystal display apparatus incorporating an active matrix substrate according to a first embodiment of the present invention. In FIG. 1, a liquid crystal display apparatus 1 according to the present embodiment includes a liquid crystal panel 2 and a backlight apparatus 3. The liquid crystal panel 2 is arranged with an upper side thereof in FIG. 1 serving as a viewing side (a display surface side). The backlight apparatus 3 is arranged at a non-display surface side (a lower side in FIG. 1) of the liquid crystal panel 2, and produces illumination light for illuminating the liquid crystal panel 2.

The liquid crystal panel 2 includes a counter substrate 4 and an active matrix substrate 5 of the present invention, which constitute a pair of substrates, as well as polarizing plates 6 and 7 that are provided on the outer surfaces of the counter substrate 4 and the active matrix substrate 5, respectively. A later-described liquid crystal layer is held between the counter substrate 4 and the active matrix substrate 5. Planar, transparent glass material or transparent synthetic resin, such as acrylic resin, is used for the counter substrate 4 and the active matrix substrate 5. Resin films made from triacetyl cellulose (TAC), polyvinyl alcohol (PVA), or the like are used for the polarizing plates 6, 7. The polarizing plates 6, 7 are each attached to a corresponding one of the counter substrate 4 and the active matrix substrate 5 so as to cover at least an effective display region on a display surface of the liquid crystal panel 2. There are cases in which a λ/4 retarder (a quarter wave plate) is arranged between the polarizing plates 6, 7 and the liquid crystal layer.

The active matrix substrate 5 is one of the aforementioned pair of substrates. Pixel electrodes, thin-film transistors (TFTs), and the like are formed between the active matrix substrate 5 and the aforementioned liquid crystal layer in correspondence with a plurality of pixels included in the display surface of the liquid crystal panel 2 (the details will be described later). On the other hand, the counter substrate 4 is the other of the pair of substrates (counter substrate), and includes color filters, a counter electrode, and the like that are formed so as to oppose the aforementioned liquid crystal layer (not shown).

The liquid crystal panel 2 is also provided with a flexible printed circuit (FPC) 8 connected to a control apparatus (not shown) that performs drive control of the liquid crystal panel 2. By operating the aforementioned liquid crystal layer on a pixel-by-pixel basis, the display surface is driven on a pixel-by-pixel basis, thereby displaying a desired image on the display surface.

It should be noted that the liquid crystal panel 2 may have any liquid crystal mode and pixel structure. The liquid crystal panel 2 may also have any driving mode. That is to say, any liquid crystal panel capable of displaying information can be used as the liquid crystal panel 2. Therefore, a detailed configuration of the liquid crystal panel 2 is not shown in FIG. 1, and a description thereof is also omitted.

The backlight apparatus 3 includes a light emitting diode 9 serving as a light source, and a light guiding plate 10 that is arranged to oppose the light emitting diode 9. Furthermore, in the backlight apparatus 3, the light emitting diode 9 and the light guiding plate 10 are held by a bezel 14 having an L-shaped cross section, with the liquid crystal panel 2 arranged above the light guiding plate 10. A case 11 is mounted on the counter substrate 4. In this way, the backlight apparatus 3 is attached to the liquid crystal panel 2. They are integrated as the transmissive liquid crystal display apparatus 1 in which illumination light from the backlight apparatus 3 is incident on the liquid crystal panel 2.

Synthetic resin, such as transparent acrylic resin, is used for the light guiding plate 10, and light from the light emitting diode 9 enters the light guiding plate 10. A reflecting sheet 12 is arranged at a side of the light guiding plate 10 opposite from the liquid crystal panel 2 (counter surface side). Optical sheets 13, such as a lens sheet and a diffusion sheet, are provided at the liquid crystal panel 2 side (light emitting surface side) of the light guiding plate 10. Light from the light emitting diode 9 is guided inside the light guiding plate 10 in a predetermined light guiding direction (in FIG. 1, a direction from the left side to the right side), converted into the aforementioned illumination light that is planar and has uniform luminance, and then supplied to the liquid crystal panel 2.

Although the foregoing description has introduced a configuration with the edge-lit backlight apparatus 3 having the light guiding plate 10, the present embodiment is not limited in this way, and a direct-lit backlight apparatus may be used. It is also possible to use a backlight apparatus having the light source other than the light emitting diode, such as a cold cathode fluorescent tube and a hot cathode fluorescent tube.

Specifics of the liquid crystal panel 2 according to the present embodiment will now be described, additionally with reference to FIG. 2.

Figure 2:
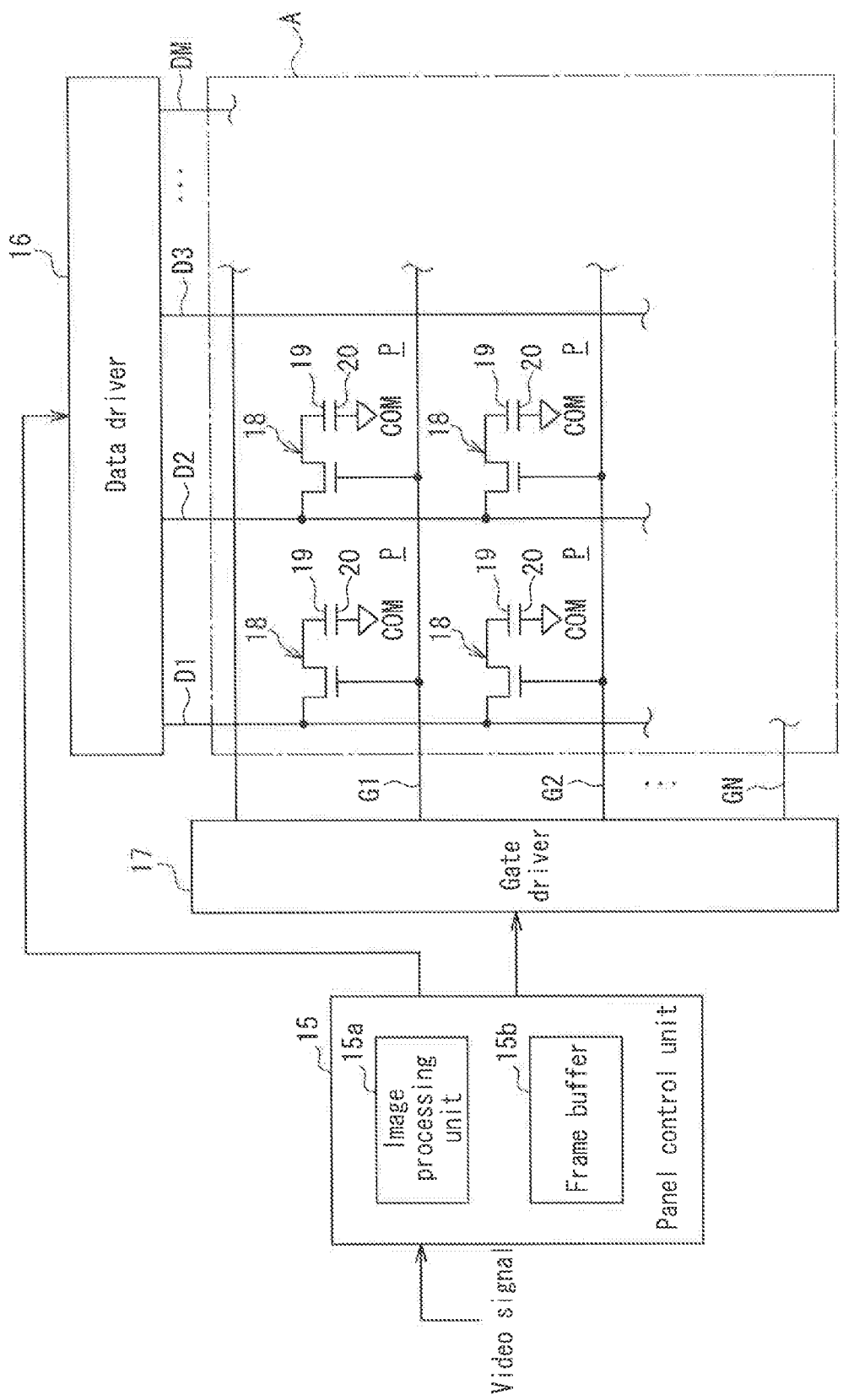
FIG. 2 is a diagram for describing a configuration of a liquid crystal panel shown in FIG. 1.

FIG. 2 is a diagram for describing a configuration of the liquid crystal panel shown in FIG. 1.

In FIG. 2, the liquid crystal display apparatus 1 (FIG. 1) is provided with a panel control unit 15 that performs drive control of the aforementioned liquid crystal panel 2 (FIG. 1) serving as a display unit for displaying information such as characters and images, as well as a data driver (source driver) 16 and a gate driver 17 that operate based on instruction signals from the panel control unit 15.

The panel control unit 15 is provided in the aforementioned control apparatus and receives, as input, a video signal from outside the liquid crystal display apparatus 1. The panel control unit 15 includes an image processing unit 15a that applies predetermined image processing to the input video signal and generates instruction signals to the data driver 16 and the gate driver 17, and a frame buffer 15b that can store display data corresponding to one frame included in the input video signal. The panel control unit 15 performs drive control of the data driver 16 and the gate driver 17 in accordance with the input video signal. As a result, information corresponding to the video signal is displayed on the liquid crystal panel 2.

The data driver 16 and the gate driver 17 are arranged on the active matrix substrate 5. Specifically, the data driver 16 is arranged on a surface of the active matrix substrate 5 so as to extend along the horizontal direction of the liquid crystal panel 2, which serves as a display panel, in a region outside an effective display region A of the liquid crystal panel 2. On the other hand, the gate driver 17 is arranged on the surface of the active matrix substrate 5 so as to extend along the vertical direction of the liquid crystal panel 2 in the region outside the aforementioned effective display region A. It should be noted that the gate driver 17 may be made up of two separate gate drivers that are provided with the effective display region A interposed therebetween, as will be described later in detail, or the gate driver 17 may be arranged so as to extend along the horizontal direction of the liquid crystal panel 2.

The data driver 16 and the gate driver 17 are drive circuits that drive a plurality of pixels P in the liquid crystal panel 2 on a pixel-by-pixel basis. The data driver 16 and the gate driver 17 are connected respectively to a plurality of data bus lines (source wires) D1 to DM (M is an integer equal to or larger than two, and hereinafter these lines are collectively referred to as "D") and a plurality of gate bus lines (gate wires) G1 to GN (N is an integer equal to or larger than two, and hereinafter these lines are collectively referred to as "G"). These data bus lines D and gate bus lines G are arrayed in a matrix pattern such that they intersect on a later-described base member that is included in the active matrix substrate 5 and is made from transparent glass material or transparent synthetic resin. That is to say, the data bus lines D are provided on the aforementioned base member in parallel to the column direction of the matrix (the vertical direction of the liquid crystal panel 2), whereas the gate bus lines G are provided on the aforementioned base member in parallel to the row direction of the matrix (the horizontal direction of the liquid crystal panel 2).

The aforementioned pixels P are provided in the vicinity of intersections between the data bus lines D and the gate bus lines G. Each pixel P includes a first thin-film transistor 18 serving as a first switching element, and a pixel electrode 19 connected to the first thin-film transistor 18. Each pixel P is structured such that a counter electrode 20 opposes the pixel electrode 19 with the aforementioned liquid crystal layer in the liquid crystal panel 2 interposed therebetween. That is to say, on the active matrix substrate 5, the first thin-film transistors 18 and the pixel electrodes 19 are provided in one-to-one relationship with the pixels.

Furthermore, on the active matrix substrate 5, regions of the plurality of pixels P are each formed in a corresponding one of regions that are defined by the data bus lines D and the gate bus lines G in a matrix pattern. The plurality of pixels P include red (R), green (G), and blue (B) pixels. The R, G, and B pixels are arranged sequentially in parallel to each of the gate bus lines G1 to GN in this order, for example. The R, G, and B pixels can display corresponding colors with a layer of the aforementioned color filters provided on the counter substrate 4.

On the active matrix substrate 5, based on an instruction signal from the image processing unit 15a, the gate driver 17 sequentially outputs scan signals (gate signals) to the gate bus lines G1 to GN for placing gate electrodes of the corresponding first thin-film transistors 18 in an on state. Based on an instruction signal from the image processing unit 15a, the data driver 16 outputs data signals (voltage signals (gradation voltages)) compliant with the luminance (gradation) of a display image to the corresponding data bus lines D1 to DM.

Specifics of main elements of the active matrix substrate 5 according to the present embodiment will now be described, additionally with reference to FIGS. 3 to 10.

Figure 3:
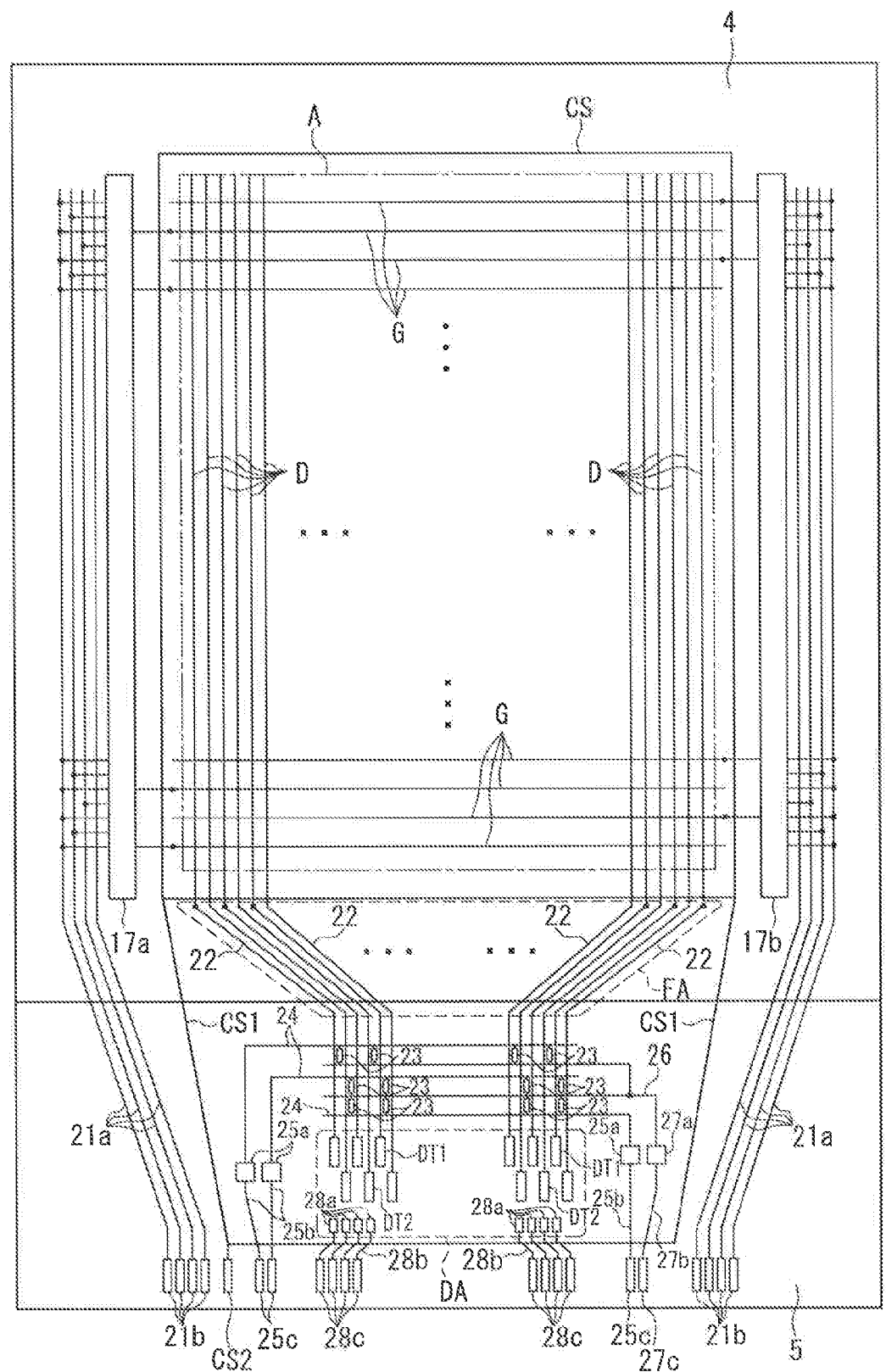
FIG. 3 is a plan view for describing main elements of the aforementioned active matrix substrate.
Figure 4:
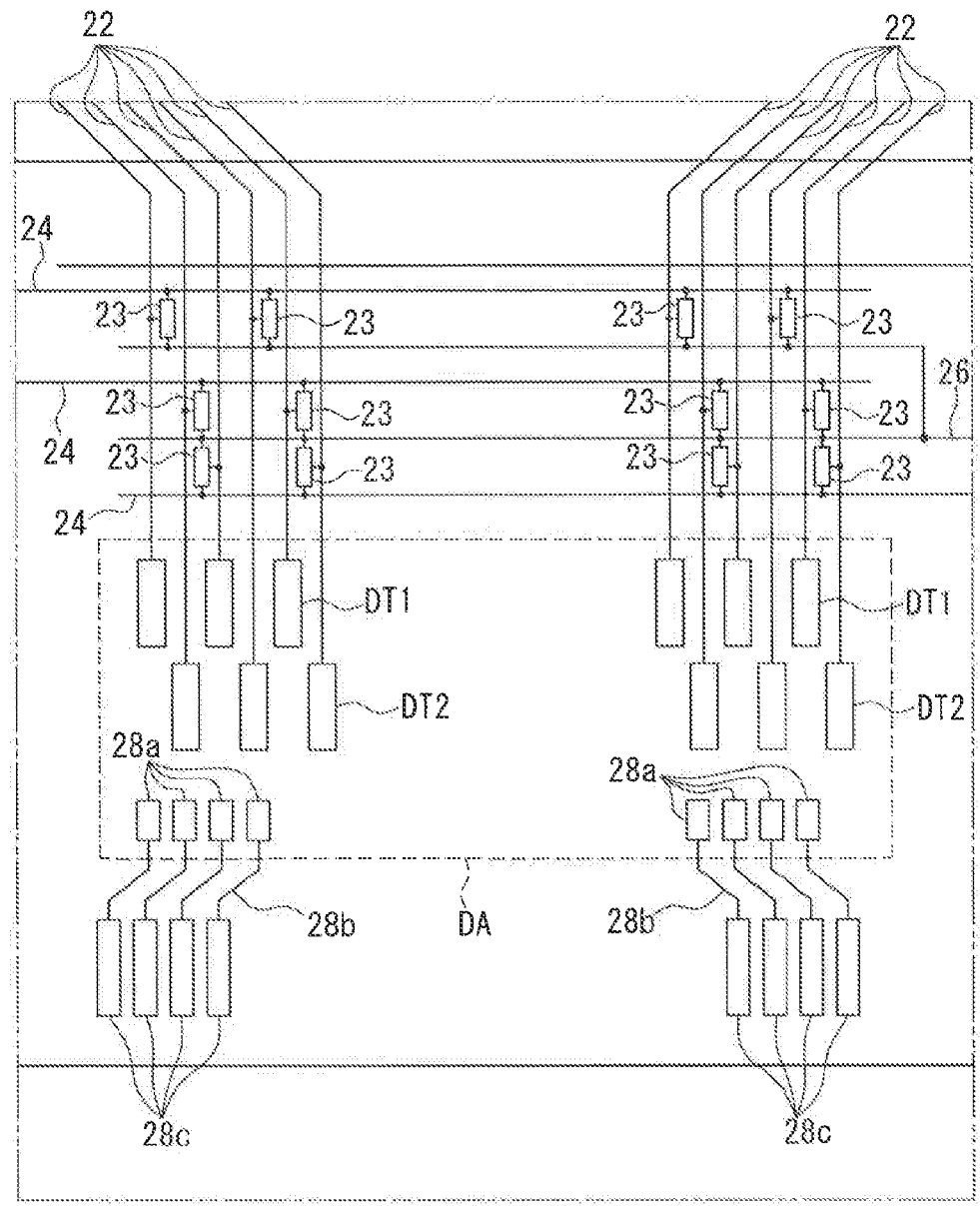
FIG. 4 is an enlarged plan view for describing a portion on which a data driver is mounted and the surroundings thereof shown in FIG. 3.
Figure 5:
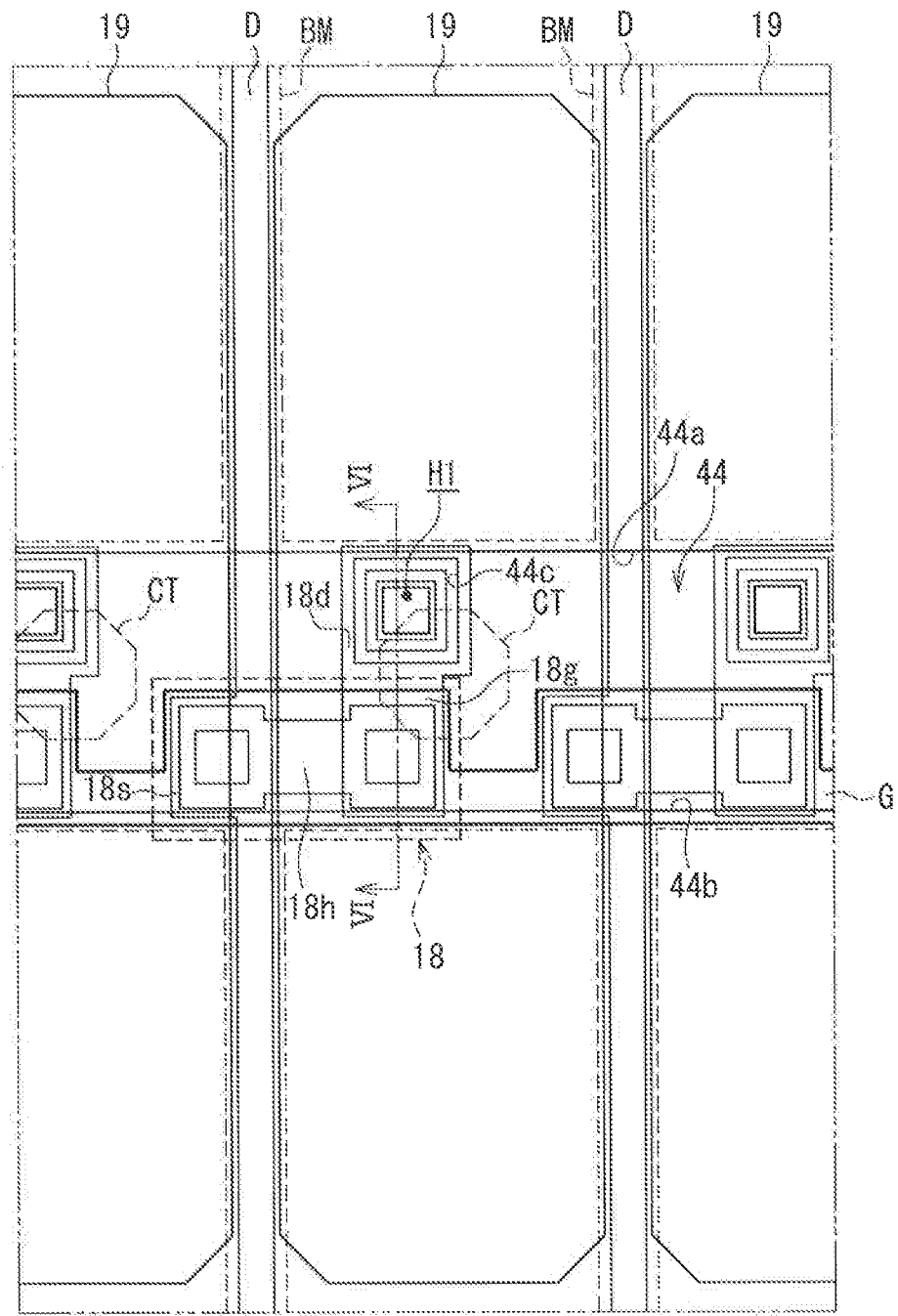
FIG. 5 is an enlarged plan view for describing a pixel structure of the aforementioned liquid crystal panel.
Figure 6:
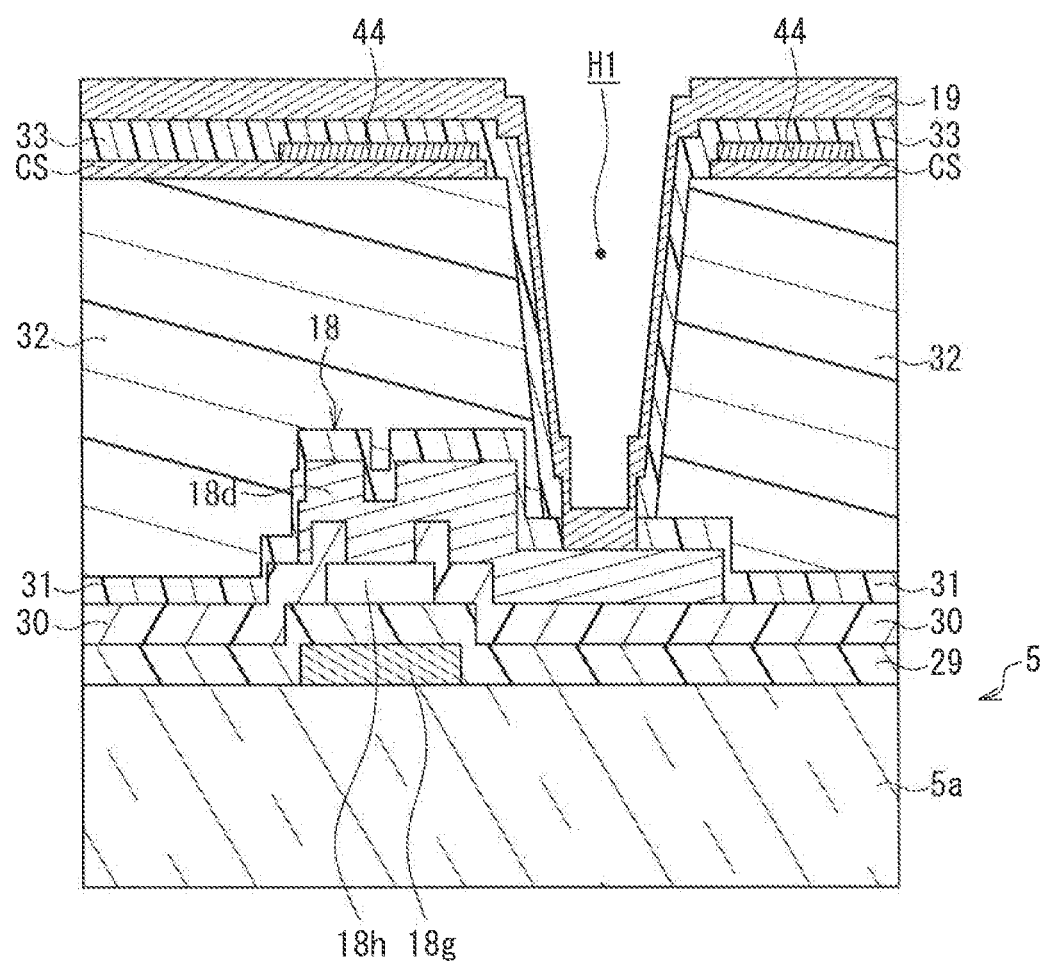
FIG. 6 is a cross-sectional view taken along the line VI-VI of FIG. 5.
Figure 7:
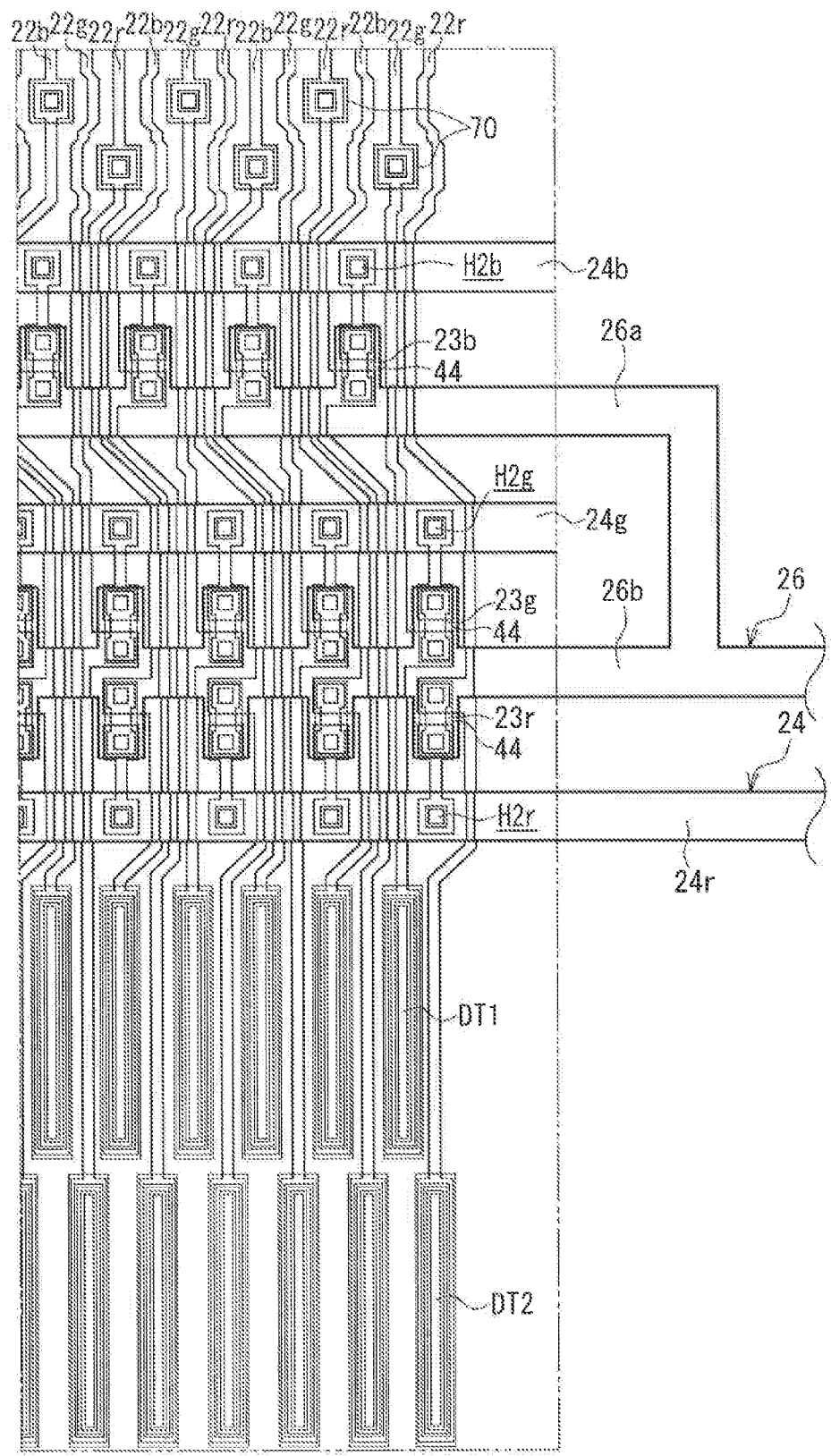
FIG. 7 is a diagram for describing configurations of main elements of the active matrix substrate shown in FIG. 3.
Figure 8:
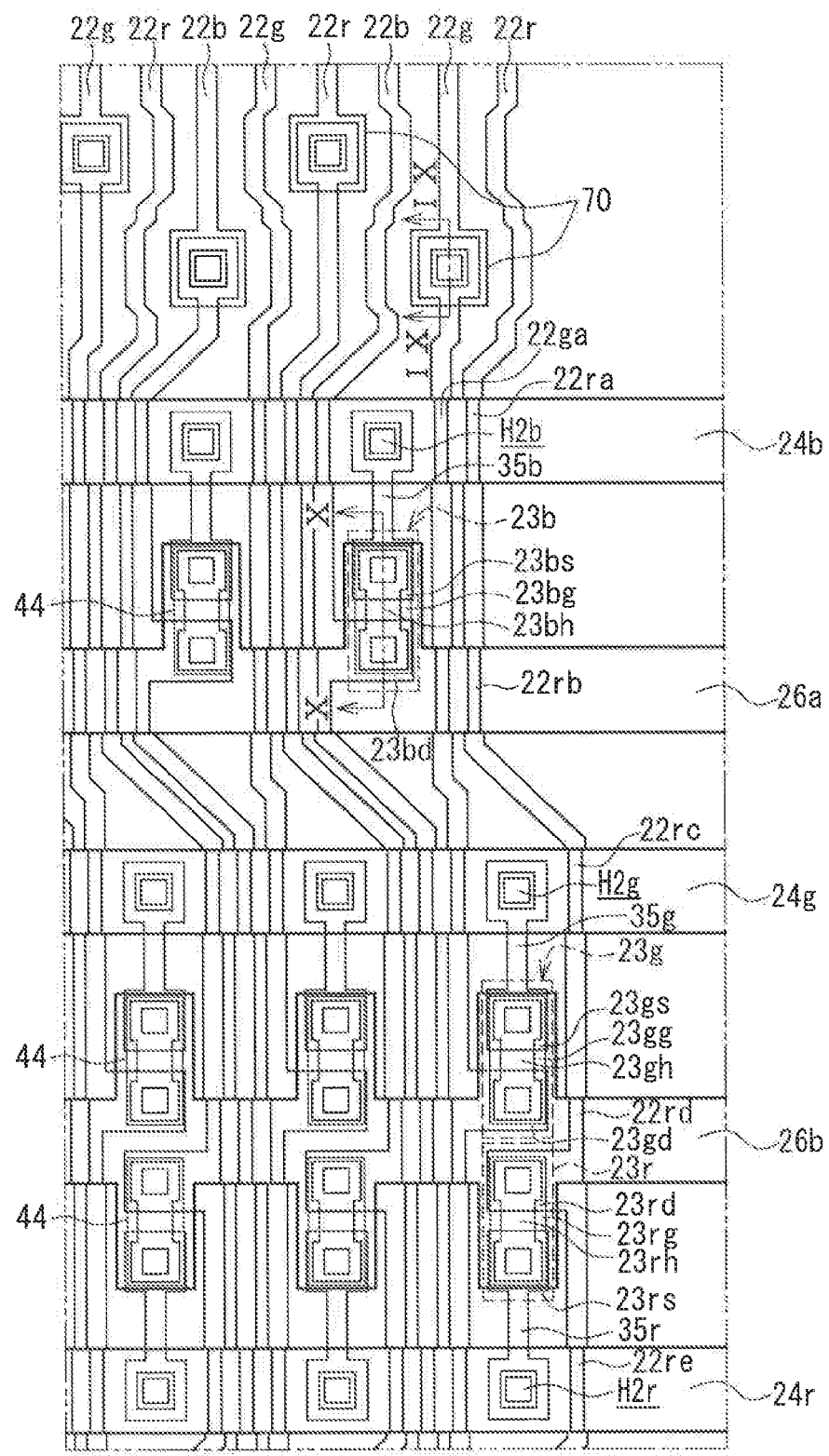
FIG. 8 is an enlarged plan view for describing second thin-film transistors and first common wires shown in FIG. 7.
Figure 9:
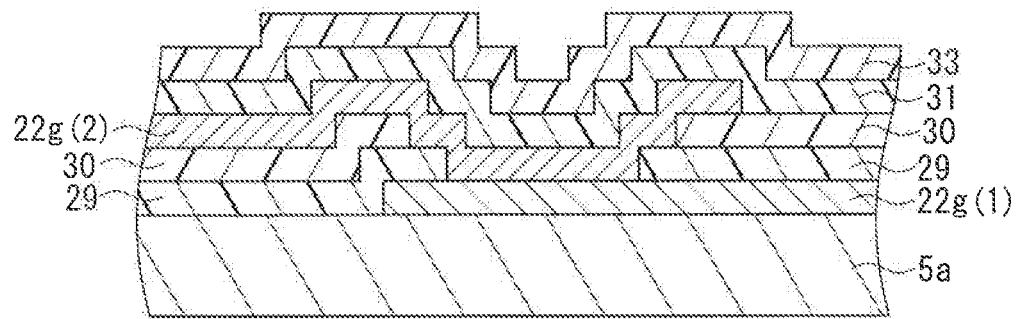
FIG. 9 is a cross-sectional view taken along the line IX-IX of FIG. 8.
Figure 10:
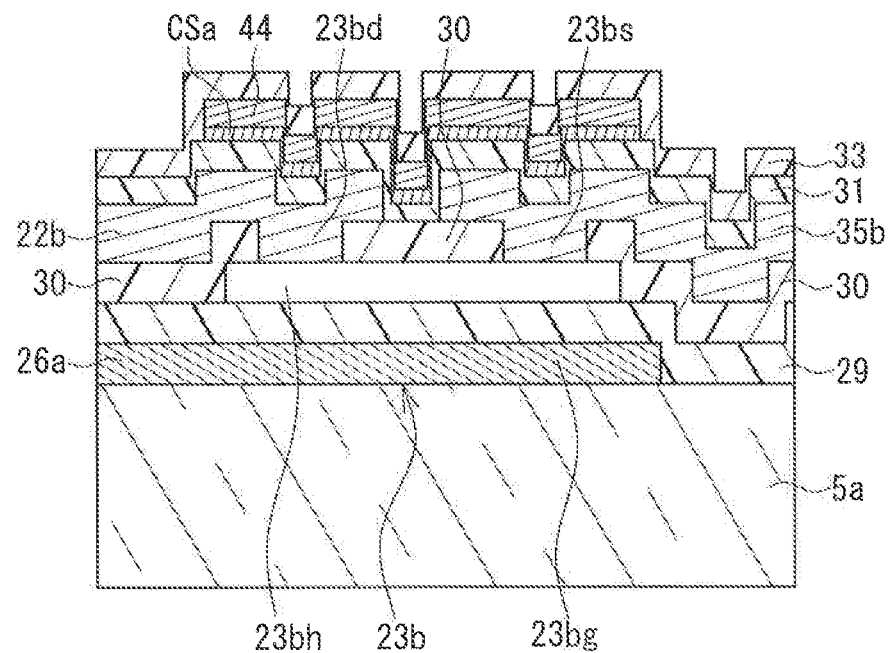
FIG. 10 is a cross-sectional view taken along the line X-X of FIG. 8.

FIG. 3 is a plan view for describing main elements of the aforementioned active matrix substrate. FIG. 4 is an enlarged plan view for describing a portion on which the data driver is mounted and the surroundings thereof shown in FIG. 3. FIG. 5 is an enlarged plan view for describing a pixel structure of the aforementioned liquid crystal panel. FIG. 6 is a cross-sectional view taken along the line VI-VI of FIG. 5. FIG. 7 is a diagram for describing configurations of main elements of the active matrix substrate shown in FIG. 3. FIG. 8 is an enlarged plan view for describing second thin-film transistors and first common wires shown in FIG. 7. FIG. 9 is a cross-sectional view taken along the line IX-IX of FIG. 8. FIG. 10 is a cross-sectional view taken along the line X-X of FIG. 8.

As shown in FIG. 3, on the active matrix substrate 5, the plurality of data bus lines D and the plurality of gate bus lines G are arrayed in a matrix pattern in a portion covered by the counter substrate 4. Furthermore, the aforementioned effective display region A is provided as indicated by a line with alternating long and short dashes in FIG. 3.

In the effective display region A, the plurality of gate bus lines G are formed in a gate layer, a later-described gate insulating film is provided so as to cover the gate bus lines G, and the plurality of data bus lines D are formed above the gate insulating film, i.e., in a source layer. In the present embodiment, the data bus lines D and the gate bus lines G are wires that are provided within the effective display region A. It should be noted that the points of connection between the bus lines formed in the source layer and the bus lines formed in the gate layer are indicated by black dots in FIG. 3 (the same goes for FIGS. 12 and 16 to follow). In addition to the foregoing description, for example, the bus lines labeled G (the bus lines extending in the horizontal direction of the sheet) may be the data bus lines, and the bus lines labeled D (the bus lines extending in the vertical direction of the sheet) may be the gate bus lines.

On the aforementioned base member of the active matrix substrate 5, gate drivers 17a, 17b are monolithically formed with the effective display region A interposed therebetween. The plurality of gate bus lines G are connected alternately to the gate drivers 17a, 17b. The gate drivers 17a, 17b are connected to gate driver driving signal terminals 21b via gate driver driving signal wires 21a. FPC connection terminals of the aforementioned FPC 8 are connected to the gate driver driving signal terminals 21b, and an instruction signal from the image processing unit 15a is input to the gate drivers 17a, 17b via the FPC 8. In addition to the foregoing description, the gate drivers 17a, 17b may be connected to the same gate bus lines G, and a gate driver may be provided only at one side of the effective display region A. Furthermore, the gate drivers 17a, 17b may be composed of an IC chip and mounted on the aforementioned base member.

On the aforementioned base member of the active matrix substrate 5, an auxiliary capacitance electrode CS is provided to generate a predetermined auxiliary capacitance for each of the pixels P. The auxiliary capacitance electrode CS is connected to an auxiliary capacitance electrode driving signal terminal CS2 via auxiliary capacitance electrode driving signal wires CS1. The FPC connection terminals of the aforementioned FPC 8 are connected to the auxiliary capacitance electrode driving signal terminal CS2, and voltage is supplied to the auxiliary capacitance electrode CS. The auxiliary capacitance electrode CS constitutes a common electrode, is made from transparent electrode material, and is provided below the pixel electrodes 19 (the details will be described later).

The data driver 16 is composed of, for example, an IC chip (driver chip), and is mounted on a rectangular portion of a base member 5a of the active matrix substrate 5 indicated by a dash line DA in FIGS. 3 and 4, which is outside the effective display region A.

Specifically, bumps (electrodes) of the data driver 16 are connected to mounting terminals DT1 and DT2 that are, for example, staggered in two rows, and to input mounting terminals 28a provided at the FPC 8 side. The mounting terminals DT1, DT2 are connected to corresponding second thin-film transistors 23 serving as second switching elements that are provided in one-to-one relationship with the data bus lines D.

That is to say, as shown in FIG. 3, each of the plurality of second thin-film transistors 23 is provided outside the aforementioned effective display region A in which the plurality of gate bus lines G and the plurality of data bus lines D are arranged in a matrix pattern, and the plurality of pixel electrodes 19 are provided in a matrix pattern as well. Each of the second thin-film transistors 23 is connected to a draw-out line 22 connecting the aforementioned mounting terminal DT1 or DT2 and the data bus line D.

The draw-out lines 22 are also provided in one-to-one relationship with the data bus lines D, and constitute a fan-out portion (oblique portion) FA that is arranged to be oblique with respect to the data bus lines D as shown in FIG. 3.

That is to say, the draw-out lines 22 include the fan-out portion FA that is arranged at an angle with respect to the direction of arrangement of the data bus lines D (the vertical direction of the liquid crystal panel 2). It should be noted that the plurality of draw-out lines 22 in the fan-out portion FA may be arranged in parallel to one another, or may be arranged in such a manner that the interval therebetween increases toward the data bus lines D. In terms of shape, the draw-out lines 22 in the fan-out portion FA are not limited to being linear, and may be, for example, curved or bent.

As will be described later in detail, among the draw-out lines 22, two neighboring draw-out lines 22 are formed from different conductive layers.

The input mounting terminals 28a are connected to data driver driving signal terminals 28c via data driver driving signal wires 28b. The FPC connection terminals of the aforementioned FPC 8 are connected to the data driver driving signal terminals 28c, and an instruction signal from the image processing unit 15a is input to the data driver 16 via the FPC 8.

As shown in FIGS. 3 and 4, at least portions of the second thin-film transistors 23 and at least portions of first common wires 24 that are connected in common to the plurality of second thin-film transistors 23 are arranged between the fan-out portion FA and the mounting terminals DT1, DT2. Specifically, the following are provided between the fan-out portion FA and the mounting terminals DT1, DT2: the plurality of aforementioned second thin-film transistors 23, three first common wires 24, later-described connection wires that each connect one of the plurality of second thin-film transistors 23 and one of the three first common wires 24, and a control line 26 that controls an operation to turn on/off each of the plurality of second thin-film transistors 23. The second thin-film transistors 23, the first common wires 24, the connection wires, and the control line 26 are installed for the purpose of performing predetermined operation processing, e.g., inspection processing and countermeasures against static electricity with respect to each of the plurality of data bus lines D, or voltage application processing performed in alignment processing for liquid crystal molecules in the aforementioned liquid crystal layer.

That is to say, as will be described later in detail, the plurality of data bus lines D are each connected to one of the first common wires 24 via one of the draw-out lines 22, one of the second thin-film transistors 23, and one of the aforementioned connection wires for each of the colors R, G, B, for example. The first common wires 24 are connected to corresponding terminals 25a that are connected to input terminals 25c via wires 25b. The FPC connection terminals of the aforementioned FPC 8 are connected to the input terminals 25c. An inspection signal associated with the aforementioned inspection processing and voltage associated with the aforementioned voltage application processing are input from the terminals 25a or the input terminals 25c. In the liquid crystal display apparatus 1 as a final product, the input terminals 25c are earthed via the aforementioned FPC 8.

As will be described later in detail, the draw-out lines 22, the aforementioned connection wires, and the first common wire 24 are provided for each of the colors R, G, B. Similarly, the second thin-film transistors 23 are provided for each of the colors R, G, B, and are classified as second thin-film transistors 23r, 23g, 23b (the details will be described later).

A terminal 27a is connected to the control line 26. The terminal 27a is also connected to an input terminal 27c via a wire 27b. The FPC connection terminals of the aforementioned FPC 8 are connected to the input terminal 27c. When performing the inspection processing and the voltage application processing, a control signal for performing an operation to turn on/off each of the plurality of second thin-film transistors 23 is input from the terminal 27a or the input terminal 27c. In the liquid crystal display apparatus 1 as a final product, a signal for turning off each of the second thin-film transistors 23 is input to the input terminal 27c via the aforementioned FPC 8.

With reference to FIGS. 5 and 6, the following describes a specific structure of the pixels P provided in the active matrix substrate 5 according to the present embodiment.

As shown in FIGS. 5 and 6, the gate bus lines G (gate layer) and gate electrodes 18g of the first thin-film transistors 18 that are constructed integrally with the gate bus lines G are provided on the aforementioned base member 5a of the active matrix substrate 5 according to the present embodiment. Layered metal films forming a multi-layer structure are used for the gate bus lines G and the gate electrodes 18g. Examples thereof include metal films forming a two-layer structure—e.g., layers of a copper film and a titanium film, layers of a copper film and a molybdenum film, and layers of a copper film and a molybdenum alloy film—or metal films forming a three-layer structure—e.g., layers of an aluminum film, a titanium film, and an aluminum film, and layers of a molybdenum film, an aluminum film, and a molybdenum film. There are cases in which a molybdenum film, an aluminum film, a chromium film, or a film of an alloy thereof is used as a single layer.

A gate insulating film 29 is provided so as to cover the base member 5a, the gate bus lines G, and the gate electrodes 18g. The gate insulating film 29 constitutes an insulating film. For example, silicon nitride (SiNx) or layered films of silicon nitride (SiNx) and silicon oxide ($SiO_2$) are used for the gate insulating film 29.

Semiconductor layers 18h of the first thin-film transistors 18 are formed on the gate insulating film 29. For example, an oxide semiconductor is used for the semiconductor layers 18h. An In—Ga—Zn—O-based, amorphous oxide semiconductor containing In, Ga, and Zn at a ratio of 1:1:1 is favorably used as the oxide semiconductor. It should be noted that the ratio of In, G, and Zn is not limited to the aforementioned ratio, and any appropriate ratio may be chosen. Other oxide semiconductor films may be used in place of the In—Ga—Zn—O-based oxide semiconductor film.

For example, the semiconductor layers 18h may be formed from a film of $InGaO_3$ (ZnO), magnesium zinc oxide ($MgxZn_{1-x}O$), cadmium zinc oxide ($CdxZn_{1-x}O$), cadmium oxide (CdO), or the like. The semiconductor layers 18h may be formed using ZnO doped with one or more types of impurity elements selected from the chemical elements in group 1, group 13, group 14, group 15, or group 17. ZnO may not be doped with impurity elements. ZnO may be in an amorphous state, a polycrystalline state, or a microcrystalline state where the amorphous state and the polycrystalline state coexist.

The amorphous, In—Ga—Zn—O-based oxide semiconductor is advantageous in that it can be manufactured at low temperature and it can achieve high mobility. It should be noted that a crystalline, In—Ga—Zn—O-based oxide semiconductor may be used in place of the amorphous, In—Ga—Zn—O-based oxide semiconductor. It is preferable that the c-axis of the crystalline, In—Ga—Zn—O-based oxide semiconductor layer be substantially perpendicular to a layer surface. A thin-film transistor having such an In—Ga—Zn—O-based oxide semiconductor layer is described in, for example, JP 2012-123475A.

In addition to the foregoing description, the semiconductor layers 18h may be constructed using, for example, amorphous silicon, polysilicon, or microcrystalline silicon.

A channel protection layer 30 is provided on the gate insulating film 29 and the semiconductor layers 18h. For example, silicon oxide ($SiO_2$) is used for the channel protection layer 30. It should be noted that the channel protection layer 30 is not an essential element, and the installation thereof may be omitted.

The data bus lines D (source layer), source electrodes 18s of the first thin-film transistors 18 that are constructed integrally with the data bus lines D, and drain electrodes 18d of the first thin-film transistors 18 are provided on the channel protection layer 30. For example, metal films forming a two-layer structure—e.g., layers of a copper film and a titanium film, layers of a copper film and a molybdenum film, and layers of a copper film and a molybdenum alloy film—or metal films forming a three-layer structure—e.g., layers of an aluminum film, a titanium film, and an aluminum film, and layers of a molybdenum film, an aluminum film, and a molybdenum film—are used for the data bus lines D, the source electrodes 18s, and the drain electrodes 18d. There are cases in which a molybdenum film, a chromium film, or a film of an alloy thereof is used as a single layer.

Interlayer insulating films 31 and 32 are sequentially provided so as to cover the data bus lines D, the source electrodes 18s, and the drain electrodes 18d. For example, silicon nitride (SiNx) is used for the interlayer insulating film 31. On the other hand, for example, a photosensitive organic film is used for the interlayer insulating film 32.

The auxiliary capacitance electrode CS is formed on the interlayer insulating film 32. For example, transparent electrode material, such as ITO and IZO, is used for the auxiliary capacitance electrode CS.

Metal electrodes 44 are provided in a layer above the auxiliary capacitance electrode (common electrode) CS in such a manner that the metal electrodes 44 are in direct contact with the auxiliary capacitance electrode CS so as to reduce the resistance of the auxiliary capacitance electrode CS. As will be described later in detail, the metal electrodes 44 are constructed to be used as light shielding films that cover at least portions of the second thin-film transistors 23. For example, molybdenum, titanium, aluminum, or an alloy or layered films thereof are used for the metal electrodes 44.

Specifically, as shown in FIGS. 5 and 6, the strip-shaped metal electrodes 44 are provided so as to cover the first thin-film transistors 18 of the pixels P. That is to say, each metal electrode 44 has edges 44a and 44b that oppose each other, has an opening 44c that is provided so as to surround a later-described contact hole H1, and is provided in parallel to gate bus lines G. As shown in FIG. 6, the metal electrodes 44 are provided below the pixel electrodes 19, in a layer above the auxiliary capacitance electrode CS, in such a manner that the metal electrodes 44 are in direct contact with the auxiliary capacitance electrode CS. As shown in FIG. 6, the metal electrodes 44 are constructed so as to cover at least portions of the first thin-film transistors 18 (i.e., the portions other than the drain electrodes 18d around the contact holes H1), and also function as the light shielding films.

An interlayer insulating film 33 is provided so as to cover the interlayer insulating film 32, the auxiliary capacitance electrode CS, and the metal electrodes 44. For example, silicon nitride (SiNx) is used for the interlayer insulating film 33. The auxiliary capacitance electrode CS and the later-described pixel electrodes 19 are layered together via the interlayer insulating film 33, thereby forming an auxiliary capacitance on a per-pixel P basis.

The pixel electrodes 19 are formed on the interlayer insulating film 33. For example, transparent electrode material, such as ITO and IZO, is used for the pixel electrodes 19.

As shown in FIG. 6, openings are provided in the interlayer insulating films 32 and 33, and the aforementioned contact holes H1 for connecting the drain electrodes 18d and the pixel electrodes 19 are formed therein.

The liquid crystal panel 2 according to the present embodiment is what is called a liquid crystal panel of a vertical electric field, and uses, for example, pixels P of a continuous pinwheel alignment (CPA) mode, which is one type of a homeotropic alignment mode. Specifically, homeotropic alignment films are provided on the inner surfaces of the active matrix substrate 5 and the counter substrate 4, and the aforementioned liquid crystal layer composed of liquid crystals with negative dielectric constant anisotropy is provided between the homeotropic alignment films. The counter substrate 4 is provided with the aforementioned counter electrode 20. The counter substrate 4 is also provided with objects for alignment control, such as alignment control protrusions CT (FIG. 5), in one-to-one relationship with the pixels P between the aforementioned counter electrode 20 and the homeotropic alignment film thereof. In addition to the foregoing description, cutouts may be provided in the counter electrode 20 in one-to-one relationship with the pixels P as the objects for alignment control in place of the alignment control protrusions CT.

Specifics of the pixels P of the aforementioned CPA mode will now be described.

With regard to the pixels P of the CPA mode, the aforementioned alignment control protrusion CT is positioned in a substantially central portion of each pixel P, and within one pixel, liquid crystals centering around the aforementioned alignment control protrusion CT continuously vary in terms of the alignment direction. That is to say, as the alignment control protrusion CT is provided in the substantially central portion of each pixel P, liquid crystal molecules in the liquid crystal layer are radially aligned around the alignment control protrusion CT, i.e., the central portion of the pixel, at the time of voltage application. By thus using the alignment control protrusions CT, the liquid crystal molecules in the pixels P can be radially aligned at the time of voltage application, and hence viewing angle properties can be improved.

The polymer sustained alignment (PSA) technology is incorporated in the pixels P according to the present embodiment. The PSA technology is intended to form an alignment sustaining layer for pretilting liquid crystals in the absence of voltage so as to restrict the alignment direction of liquid crystal molecules in the absence of voltage. The alignment sustaining layer is formed as a polymer layer by, after forming a liquid crystal cell, photopolymerizing a photopolymerizable monomer (or oligomer) that has been mixed with liquid crystal material in advance, typically in the state where voltage is applied to the liquid crystal layer. The alignment sustaining layer enables liquid crystals to, in the absence of voltage, sustain (remember) the alignment orientations and pretilt angles that are slightly tilted (by, for example, 2° to 3°) with respect to a direction perpendicular to a substrate surface of the active matrix substrate 5. As a result, a response speed related to the liquid crystal alignments at the time of voltage application can be improved. Furthermore, when a surface of the liquid crystal panel 2 has been pressed by a finger, the speed of alignment restoration can be accelerated. That is to say, by incorporating the PSA technology for the pixels P of the CPA mode, the response speed and the speed of restoration following the finger pressing can be advantageously improved.

Voltage application for implementing the PSA technology is performed using the aforementioned terminals 25a or input terminals 25c. That is to say, voltage is supplied to all of the data bus lines D via (the input terminals 25c, the wires 25b) the terminals 25a, the first common wires 24, the aforementioned connection wires, the second thin-film transistors 23, and the draw-out lines 22. Furthermore, the gate drivers 17a, 17b are driven by inputting a predetermined signal to the gate driver driving signal terminals 21b, and voltage for turning on the first thin-film transistors 18 is supplied to the gate bus lines G. As a result, voltage supplied to the aforementioned data bus lines D is supplied to the liquid crystal layer via the first thin-film transistors 18, and the alignment sustaining layer is formed.

As indicated by dash lines in FIG. 5, the counter substrate 4 is provided with black matrix films BM that cover the data bus lines D, the first thin-film transistors 18, and the contact holes H1, and an opening is formed on the pixel electrode 19 in each pixel P. The black matrix films BM are provided for the purpose of taking countermeasures against color mixture in the case where the active matrix substrate 5 and the counter substrate 4 are attached in a misaligned manner, shielding channel portions of the first thin-film transistors 18 from light, or taking countermeasures against a decrease in the display quality caused by alignment disorder of liquid crystals at the contact holes H1.

Specifics of the configurations between the draw-out lines 22 and the mounting terminals DT1, DT2 will now be described, additionally with reference to FIGS. 7 to 10.

As shown in FIGS. 7 and 8, on the active matrix substrate 5 according to the present embodiment, draw-out lines 22r, 22g, and 22b that correspond respectively to, for example, the colors R, G, and B are sequentially arrayed along the left-right direction of the figures.

The draw-out lines 22r, 22g, 22b are connected to the aforementioned mounting terminals DT1 or DT2. As shown in FIG. 7, the mounting terminals DT1, DT2 are staggered in two rows (i.e., two neighboring mounting terminals DT1, DT2 are sequentially shifted so as to be arranged in different positions along a linear direction). In this way, the plurality of mounting terminals DT1, DT2 can be efficiently installed, and the chance of the occurrence of a short circuit in the vicinity of two adjacent mounting terminals DT1, DT2 can be lowered.

The bumps (electrodes) of the data driver 16 are connected to the mounting terminals DT1, DT2. It should be noted that each of the mounting terminals DT1, DT2 is provided with an upper-layer terminal electrode that is connected to a bump (electrode) and formed from the same conductive layer as the pixel electrodes 19, and a lower-layer terminal electrode that is connected to the upper-layer terminal electrode and formed from the same conductive layer as the data bus lines D (not shown).

In FIGS. 7 and 8, among the plurality of draw-out lines 22r, 22g, 22b, one of two neighboring draw-out lines 22 is formed from the same conductive layer as the gate bus lines G (gate layer), whereas the other of the two neighboring draw-out lines 22 is formed from the same conductive layer as the data bus lines D (source layer). Specifically, one of two neighboring draw-out lines 22 is formed in the gate layer (first conductive layer) on the base member 5a (FIG. 6), whereas the other of the two neighboring draw-out lines 22 is formed in the source layer (second conductive layer) above the gate insulating film 29 that covers the gate layer.

The aforementioned gate layer is formed on the base member 5a (FIG. 6) using the same metal material as the gate electrodes 18g shown in FIG. 6 (a plurality of types of metal material having a single-layer or layered structure), through the same manufacturing processes as the gate electrodes 18g shown in FIG. 6. On the other hand, the aforementioned source layer is formed above the base member 5a using the same metal material as the source electrodes 18s and the drain electrodes 18d shown in FIG. 6 (a plurality of types of metal material having a single-layer or layered structure), through the same manufacturing processes as the source electrodes 18s and the drain electrodes 18d shown in FIG. 6.

On the active matrix substrate 5, the draw-out lines 22r, 22g, 22b formed in the gate layer (the same conductive layer as the gate bus lines G) are cross-connected from the gate layer to the source layer (the same conductive layer as the data bus lines D) at cross-connection portions 70.

Specifically, as shown in FIG. 9, a draw-out line 22g (1) in the gate layer is formed on the base member 5a, and the gate insulating film 29 and the channel protection layer 30 are further formed on the base member 5a so as to cover the draw-out line 22g (1). A draw-out line 22g (2) is formed on the gate insulating film 29 and the channel protection layer 30. In a section where the draw-out line 22g(1) and the draw-out line 22g (2) overlap, the draw-out line 22g (1) and the draw-out line 22g (2) are in direct contact with each other without the gate insulating film 29 and the channel protection layer 30 therebetween. The interlayer insulating film 31 is further formed on the gate insulating film 29, the channel protection layer 30, and the draw-out line 22g (2) so as to cover the same. The interlayer insulating film 33 is further formed on the interlayer insulating film 31. There are cases in which the interlayer insulating film (photosensitive organic film) 32 is formed between the interlayer insulating film 31 and the interlayer insulating film 33.

At the cross-connection portion 70, the draw-out line 22g (1) and the draw-out line 22g (2) are formed so as to overlap in a layer thickness direction. In a part of a region where the draw-out line 22g (1) and the draw-out line 22g (2) overlap, the gate insulating film 29 and the channel protection layer 30 are removed to bring these lines in contact with each other. At a contact portion where the draw-out line 22g (1) and the draw-out line 22g (2) are in contact with each other, a wire formed from the draw-out line 22g (1) in the gate layer is cross-connected to the draw-out line 22g (2) in the source layer.

It should be noted that, similarly to the aforementioned draw-out line 22g described with reference to FIG. 9, the draw-out lines 22r, 22b formed in the gate layer are cross-connected from the gate layer to the source layer via the cross-connection portions 70.

As shown in FIG. 8, the draw-out lines 22 have a larger line width at the cross-connection portions 70 than at any other portions. For example, provided that each of the draw-out lines 22r, 22g, 22b has a widthwise dimension of 3 μm, the cross-connection portions 70 have an area of, for example, 19 μm×19 μm. In this way, the rate of the occurrence of trouble, such as defective contact, in the cross-connection portions 70 can be lowered.

In concert with a portion of each draw-out line 22 at the cross-connection portion 70, which has a large line width, two neighboring draw-out lines 22 on the left and right thereof (e.g., the draw-out lines 22r and 22b on the right and left of the draw-out line 22g at the cross-connection portion 70) have a large wire interval therebetween. By thus increasing the interval between neighboring wires on both sides in accordance with the line width of the wire at each cross-connection portion 70, wires can be efficiently installed even in a region where a plurality of wires are concentrated.

The cross-connection portions 70 are staggered in such a manner that each cross-connection portion 70 is positionally shifted relative to another cross-connection portion 70 that neighbors it via the draw-out line 22. In this way, the plurality of cross-connection portions 70 can be efficiently installed, and the chance of the occurrence of a short circuit in the vicinity of two adjacent cross-connection portions 70 can be lowered.

By thus cross-connecting the draw-out lines 22 formed in the gate layer from the gate layer to the source layer at a lower side relative to the fan-out portion FA, i.e., in the vicinity of the second thin-film transistors (second switching elements) 23, the draw-out lines 22 provided in separate layers, i.e., the gate layer and the source layer, can be kept long in the fan-out portion FA. Accordingly, the chance of a short circuit between neighboring draw-out lines 22 can be lowered.

As shown in FIGS. 7 and 8, on the active matrix substrate 5 according to the present embodiment, the draw-out lines 22r, 22g, 22b are provided such that they are orthogonal to a branch wire 26a or 26b of the control line 26 formed in the gate layer (first conductive layer). As will be described later in detail, the branch wires 26a and 26b are constructed integrally with corresponding gate electrodes 23*rg*, 23*gg*, 23*bg* of the second thin-film transistors 23*r*, 23*g*, 23*b*.

The draw-out lines 22 are connected to the corresponding first common wires 24 formed in the gate layer (first conductive layer) via the corresponding second thin-film transistors 23. Specifically, as shown in FIG. 8, the draw-out lines 22*r*, 22*g*, and 22*b* are connected to the first common wires 24*r*, 24*g*, and 24*b* via the second thin-film transistors 23*r*, 23*g*, and 23*b*, connection wires 35*r*, 35*g*, 35*b* formed in the source layer (second conductive layer), and terminal contact holes H2*r*, H2*g*, and H2*b*, respectively. In other words, a predetermined number of data bus lines D are connected to each of the first common wires 24*r*, 24*g*, 24*b* via a predetermined number of second thin-film transistors 23*r*, 23*g*, or 23*b*.

On the active matrix substrate 5 according to the present embodiment, among the draw-out lines 22 formed from the same conductive layer as the gate bus lines G, and among the draw-out lines 22 formed from the same conductive layer as the data bus lines D, two neighboring draw-out lines 22 are connected respectively to two different first common wires 24.

Specifically, the second draw-out line 22*g* from the right in FIG. 7 and the fourth draw-out line 22*r* from the right in FIG. 7 are both formed from the same conductive layer as the gate bus lines G, but these draw-out lines 22*g* and 22*r* are connected respectively to different first common wires 24*g* and 24*r*.

The first draw-out line 22*r* from the right in FIG. 7 and the third draw-out line 22*b* from the right in FIG. 7 are both formed from the same conductive layer as the data bus lines D, but these draw-out lines 22*r* and 22*b* are connected respectively to different first common wires 24*r* and 24*b*.

On the active matrix substrate 5 according to the present embodiment, the branch wire 26*a* of the control line 26 and the gate insulating film 29 that is formed so as to cover the branch wire 26*a* of the control line 26 are provided on the base member 5*a* of the active matrix substrate 5. A gate electrode 23*bg* of the second thin-film transistor 23*b* is constructed integrally with the branch wire 26*a* of the control line 26.

A semiconductor layer 23*bh* of the second thin-film transistor 23*b* and the channel protection layer 30 are sequentially layered above the gate insulating film 29. The semiconductor layer 23*bh* is constructed from, for example, an oxide semiconductor, similarly to the semiconductor layers 18*h* of the first thin-film transistors 18.

A drain electrode 23*bd* and a source electrode 23*bs* of the second thin-film transistor 23*b*, which are constructed integrally with the draw-out line 22*b* and the connection wire 35*b*, respectively, are provided on the semiconductor layer 23*bh*. The interlayer insulating film 31 and the interlayer insulating film 33 are sequentially layered on the drain electrode 23*bd*, the source electrode 23*bs*, and the channel protection layer 30. It should be noted that the interlayer insulating film (photosensitive organic film) 32 may be formed between the interlayer insulating film 31 and the interlayer insulating film 33.

It should be noted that an example configuration of a second thin-film transistor 23*g* is basically similar to that of the aforementioned second thin-film transistor 23*b*. Specifically, in the second thin-film transistor 23*g*, a gate electrode 23*gg* is formed from the branch wire 26*b* of the control line 26, a drain electrode 23*gd* is formed from the draw-out line 22*g*, and a source electrode 23*gs* is formed from the connection wire 35*g*.

An example configuration of a second thin-film transistor 23*r* is equivalent to a configuration where the positions of the drain electrode 23*bd* and the source electrode 23*bs* of the aforementioned second thin-film transistor 23*b* are reversed. Specifically, in the second thin-film transistor 23*r*, a gate electrode 23*rg* is formed from the branch wire 26*b* of the control line 26, a drain electrode 23*rd* is formed from the draw-out line 22*r*, and a source electrode 23*rs* is formed from the connection wire 35*r*.

As shown in FIGS. 7 and 8, at the second thin-film transistors 23, the rectangular metal electrodes 44 are provided in such a manner that four edges thereof surround the corresponding semiconductor layers 23*rh*, 23*gh*, 23*bh* of the second thin-film transistors 23*r*, 23*g*, 23*b*.

Specifically, for example, at the second thin-film transistor 23*b* shown in FIG. 10, an electrode film CSa formed from the same conductive layer as the metal electrode 44 and the auxiliary capacitance electrode CS is provided between the interlayer insulating films 31 and 33. The metal electrode 44 is provided above the gate electrode 23*bg*, the semiconductor layer 23*bh*, the drain electrode 23*bd*, and the source electrode 23*bs* of the second thin-film transistor 23*b* so as to function as a light shielding film therefor. As shown in FIG. 10, the metal electrode (light shielding film) 44 is covered by the interlayer insulating film 33.

In order to inhibit the generation of a leak current, which will be described later, it is preferable to form the metal electrodes 44 so as to completely cover channel portions of the second thin-film transistors 23*r*, 23*g*, 23*b* when viewed from a direction perpendicular to the substrate surface of the active matrix substrate 5.

As shown in FIGS. 7 and 8, for example, each draw-out line 22*r* is provided with narrow portions 22*ra*, 22*rb*, 22*rc*, 22*rd*, and 22*re* with small widthwise dimensions, respectively at portions intersecting with the first common wire 24*b*, the branch wire 26*a* of the control line 26, the first common wire 24*g*, the branch wire 26*b* of the control line 26, and the first common wire 24*r*.

By thus providing the narrow portions 22*ra*, 22*rb*, 22*rc*, 22*rd*, 22*re*, the areas of intersections between the draw-out lines 22*r* and the first common wire 24*b*, the branch wire 26*a* of the control line 26, the first common wire 24*g*, the branch wire 26*b* of the control line 26, and the first common wire 24*r* can be reduced. As a result, the active matrix substrate 5 according to the present embodiment can inhibit a signal delay in the data bus lines D, and prevent a decrease in the display quality after mounting the chip of the data driver 16 (i.e., the display quality of the liquid crystal display apparatus 1 as a final product). Furthermore, during the inspection, a delay in an inspection control signal for the control line 26 can be inhibited. Therefore, at the time of display for the inspection, unevenness in display can be easily reduced, and erroneous detection of defects can be inhibited.

In addition to the foregoing description, for example, the widthwise dimension of the first common wire 24*b*, the branch wire 26*a* of the control line 26, the first common wire 24*g*, the branch wire 26*b* of the control line 26, or the first common wire 24*r* may be reduced so as to reduce the area of intersection with the corresponding draw-out lines 22*r*.

It is preferable to input, for example, a signal for placing the second thin-film transistors (second switching elements) 23 in an off state to the control line 26 via the FPC connection terminal 27*c*, especially in the stage as a final product. In this way, the second thin-film transistors 23 can be reliably placed in the off state, and a decrease in the display quality of the final product (e.g., shadowing) can be prevented.

On the active matrix substrate 5 according to the present embodiment constructed in the foregoing manner, the metal electrodes 44 are provided below the pixel electrodes 19. At least portions of the plurality of second thin-film transistors (second switching elements) 23 are covered by the light shielding films formed from the metal electrodes 44, and the metal electrodes (light shielding films) 44 are covered by the interlayer insulating film 33. Accordingly, unlike the conventional examples described earlier, the present embodiment makes it possible to construct the low-cost active matrix substrate 5 that can easily protect the second thin-film transistors 23 without expanding the manufacturing processes.

That is to say, on the active matrix substrate 5 according to the present embodiment, in the pixels P of the display unit, the metal electrodes 44 are used as the light shielding films for the second thin-film transistors 23, and the interlayer insulating film 33 is used as a protection film for the light shielding films. In this way, the light shielding films for the second thin-film transistors 23 can be reliably formed and the second thin-film transistors 23 can be easily protected, without expanding the manufacturing processes.

As the second thin-film transistors 23 are thus covered by the light shielding films formed from the metal electrodes 44, an inspection operation using the second thin-film transistors 23 and the like can be performed with high precision. As a result, on the active matrix substrate 5 according to the present embodiment, the aforementioned light shielding films can alleviate the influences of an inspection environment on display during the inspection, thereby inhibiting an erroneous judgment during the inspection. Specifically, it is possible to prevent the generation of a leak current caused by the incidence of external light on the second thin-film transistors 23. Due to the functions of the light shielding films, the second thin-film transistors 23 need not be coated with resin or a tape with high light shielding properties, or covered by a bezel.

In the present embodiment, the plurality of second thin-film transistors 23 are provided outside the effective display region A in which the gate bus lines G and the data bus lines D intersect. Accordingly, operation processing, such as inspection processing and voltage application processing, can be performed appropriately for the data bus lines D using the second thin-film transistors 23.

In the present embodiment, the metal electrodes 44 are provided in a layer above the auxiliary capacitance electrode (common electrode) CS. Therefore, defective display can be inhibited. That is to say, while the auxiliary capacitance electrode CS is formed from transparent electrode material, such as ITO and IZO, these ITO and IZO generally have high resistance. Therefore, there is a possibility of the occurrence of defective display, such as flickering and shadowing, attributed to a delay in signals (voltage signals) to the auxiliary capacitance electrode CS, especially when a display region is large. For this reason, in the present embodiment, the metal electrodes 44 are layered on the auxiliary capacitance electrode CS so as to reduce the resistance and inhibit the occurrence of the aforementioned defective display.

In the present embodiment, the draw-out lines 22 include the fan-out portion FA that is arranged at an angle with respect to the direction of arrangement of the data bus lines D. At least a portion of the first common wires 24 and at least a portion of the second thin-film transistors 23 are arranged between the fan-out portion FA and the mounting terminals DT1, DT2. Accordingly, in the present embodiment, the draw-out lines 22 formed in the fan-out portion FA can be inspected for a short circuit and disconnection, and the inspection precision can be kept high even when a frame region has been downsized or in the case of high definition.

In the present embodiment, three first common wires 24r, 24g, 24b are provided, and a predetermined number of data bus lines D are connected to each of the first common wires 24r, 24g, 24b via a predetermined number of second thin-film transistors 23r, 23g, or 23b. In this way, the present embodiment enables execution of operation processing, such as inspection processing and voltage application processing, per predetermined number of data bus lines D using the first common wires 24r, 24g, 24b.

In the present embodiment, among the plurality of draw-out lines 22, one of two neighboring draw-out lines 22 is formed from the same conductive layer as the gate bus lines G, whereas the other of the two neighboring draw-out lines 22 is formed from the same conductive layer as the data bus lines D. In this way, the present embodiment can inhibit the occurrence of a short circuit and disconnection of the draw-out lines 22.

In the present embodiment, among the draw-out lines 22 formed from the same conductive layer as the gate bus lines G, and among the draw-out lines 22 formed from the same conductive layer as the data bus lines D, two neighboring draw-out lines 22 are connected respectively to two different first common wires 24. Accordingly, in the present embodiment, an inspection operation to check whether a short circuit has occurred can be easily performed by using the first common wires 24 with respect to the draw-out lines 22 formed from the same conductive layer as the gate bus lines G, as well as the draw-out lines 22 formed from the same conductive layer as the data bus lines D.

In the present embodiment, the oxide semiconductors are used for the semiconductor layers 18h, 23ah, 23bh of the first and second thin-film transistors 18, 23a, 23b. Accordingly, in the present embodiment, the high-performance and compact first and second thin-film transistors 18, 23a, 23b can be easily constructed, and an inspection operation using the first and second thin-film transistors 18, 23a, 23b can be performed with high precision.

The present embodiment uses the low-cost active matrix substrate 5 that can easily protect the second thin-film transistors (second switching elements) 23 without expanding the manufacturing processes, and hence enables easy construction of the high-performance liquid crystal display apparatus (display apparatus) 1 at low cost in simple manufacturing processes.

Second Embodiment

Figure 11:
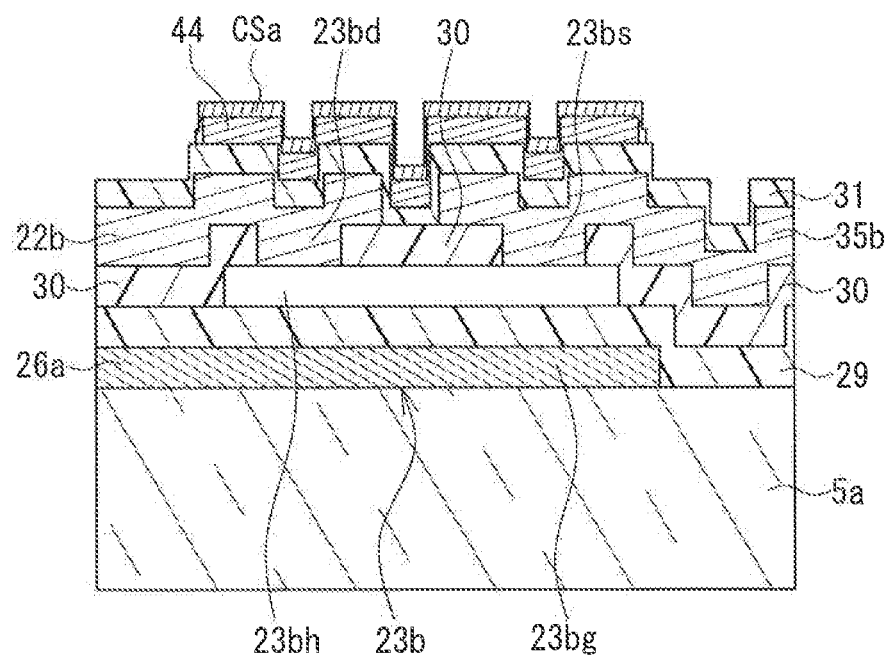
FIG. 11 is a cross-sectional view for describing second thin-film transistors and metal electrodes on an active matrix substrate according to a second embodiment of the present invention.

FIG. 11 is a cross-sectional view for describing second thin-film transistors and metal electrodes on an active matrix substrate according to a second embodiment of the present invention.

Referring to the figure, the present embodiment differs from the first embodiment described earlier mainly in that the metal electrodes are provided in a layer below an auxiliary capacitance electrode (common electrode). It should be noted that the elements that are common to the first embodiment described earlier are given the same reference numerals, and a redundant description thereof is omitted.

That is to say, as shown in the example of FIG. 11, on an active matrix substrate 5 according to the present embodiment, metal electrodes 44 and an electrode film CSa of an auxiliary capacitance electrode (common electrode) CS are formed, in this order, on an interlayer insulating film 31. As shown in FIG. 11, the metal electrodes 44 are constructed so as to cover at least portions of second thin-film transistors 23b (channel portions of the second thin-film transistors 23), and also function as light shielding films therefor, similarly to the first embodiment.

On the active matrix substrate 5 according to the present embodiment, the electrode film CSa layered on the upper side of the metal electrodes 44 is constructed so as to function as a protection layer for the metal electrodes 44, and the installation of an interlayer insulating film 33 is omitted unlike the active matrix substrate 5 according to the first embodiment shown in the example of FIG. 10.

It should be noted that, in a pixel unit provided with pixels P on the active matrix substrate 5 according to the present embodiment, the metal electrodes 44 and the auxiliary capacitance electrode CS may be provided below pixel electrodes 19, similarly to the first embodiment, or the metal electrodes 44 and the auxiliary capacitance electrode CS may be provided above the pixel electrodes 19 (not shown). When the metal electrodes 44 are provided above the pixel electrodes 19 in the foregoing manner, a counter electrode serving as a common electrode is provided above the pixel electrodes 19, in a layer above the metal electrodes 44, in a liquid crystal panel of, for example, a homogeneous alignment mode (not shown). At this time, parallel slits are formed in the counter electrode serving as the common electrode, and a horizontal electric field is generated between the counter electrode and the pixel electrodes.

With the foregoing configurations, the present embodiment can achieve the functions and effects similar to those achieved by the first embodiment described earlier.

Third Embodiment

Figure 12:
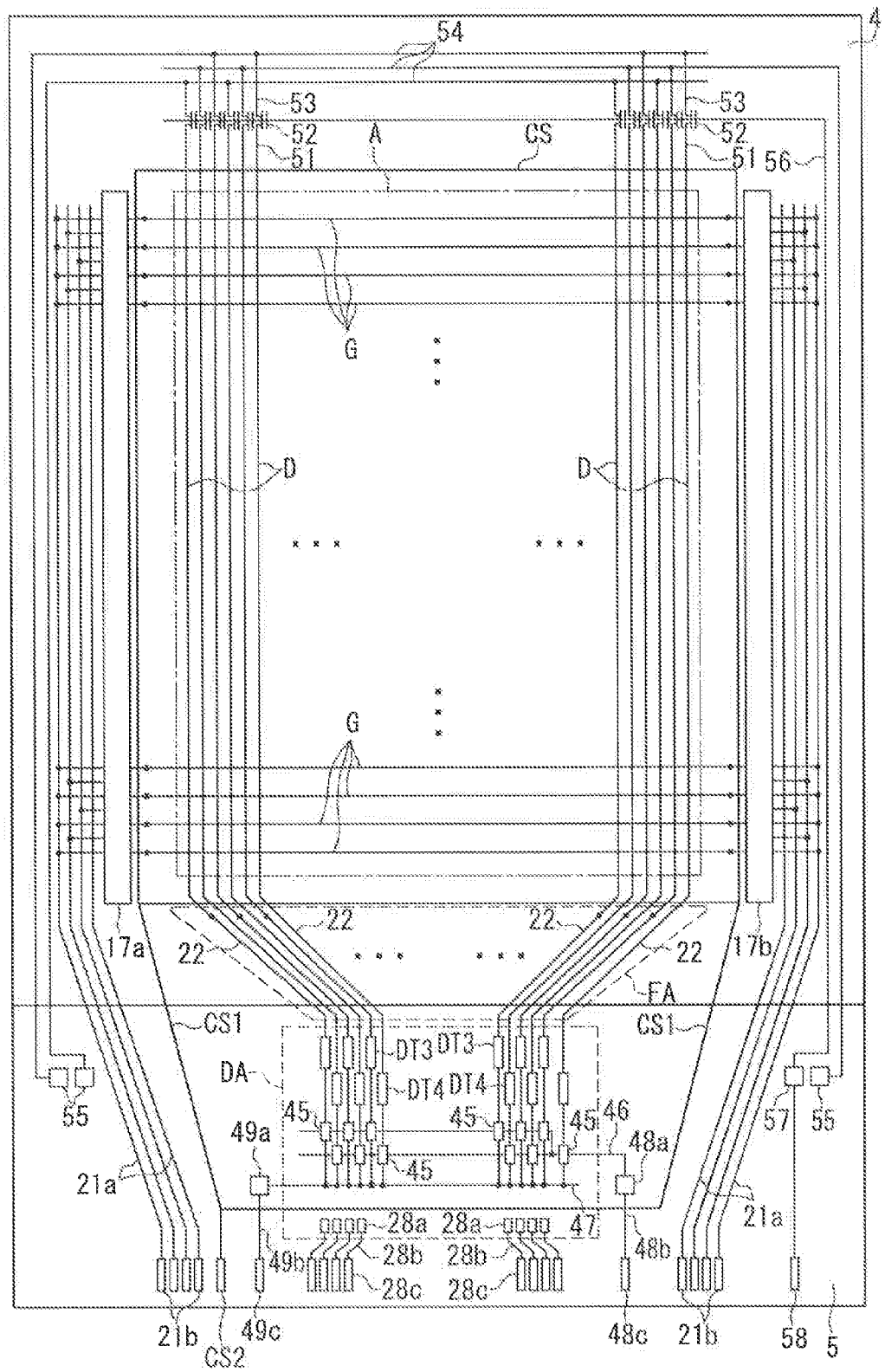
FIG. 12 is a plan view for describing main elements of an active matrix substrate according to a third embodiment of the present invention.
Figure 13:
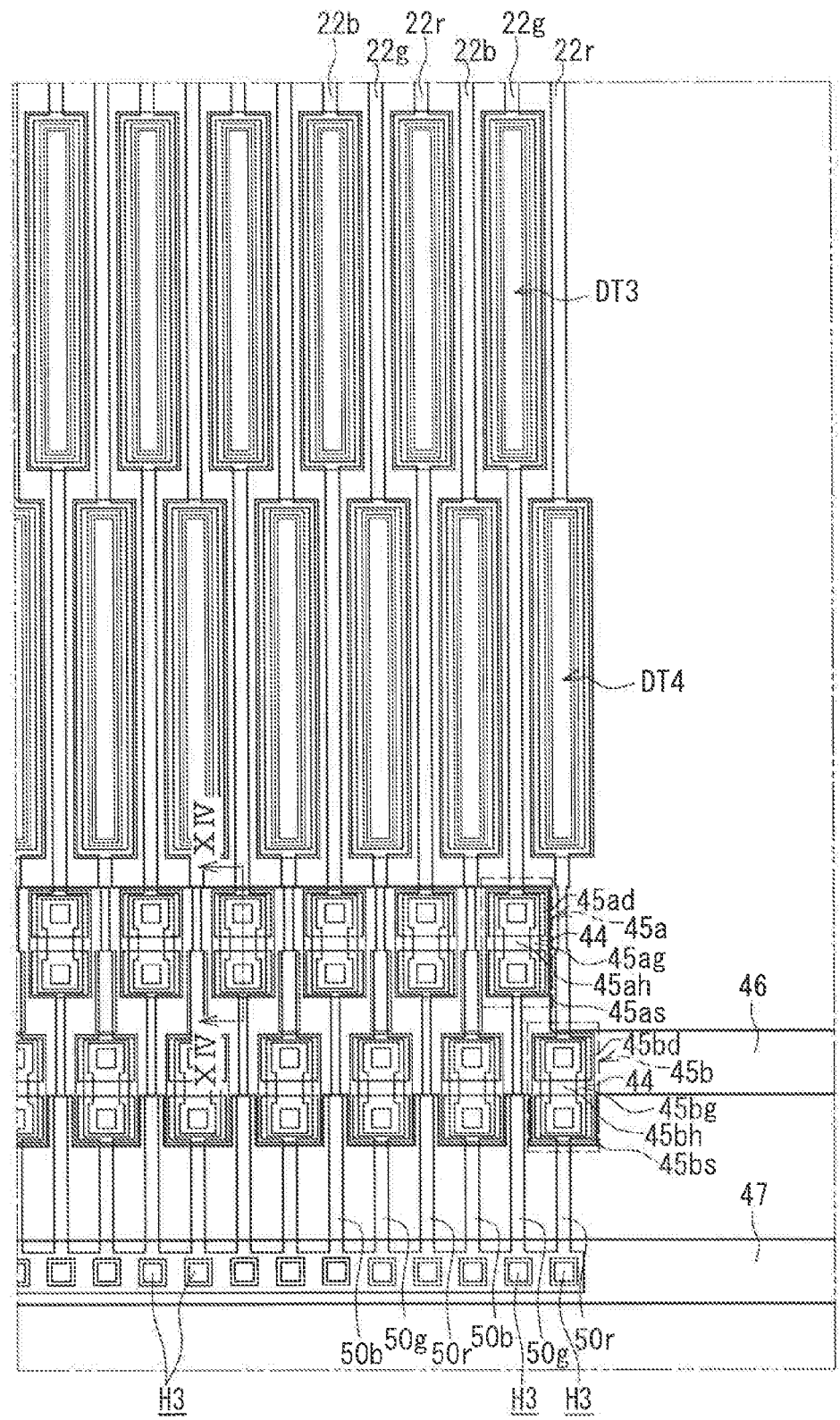
FIG. 13 is a diagram for describing configurations of main elements of the active matrix substrate shown in FIG. 12.
Figure 14:
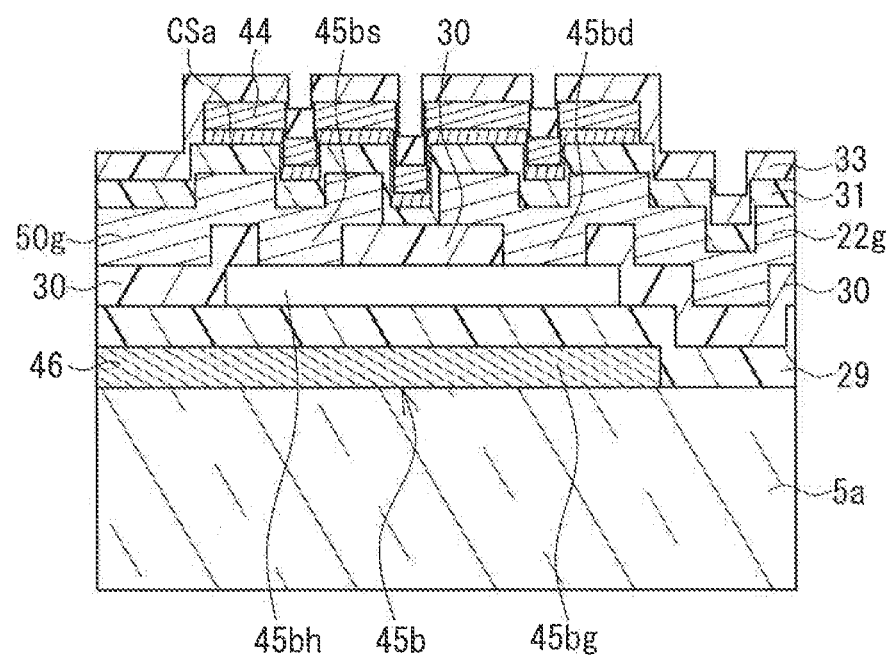
FIG. 14 is a cross-sectional view taken along the line XIV-XIV of FIG. 13.
Figure 15:
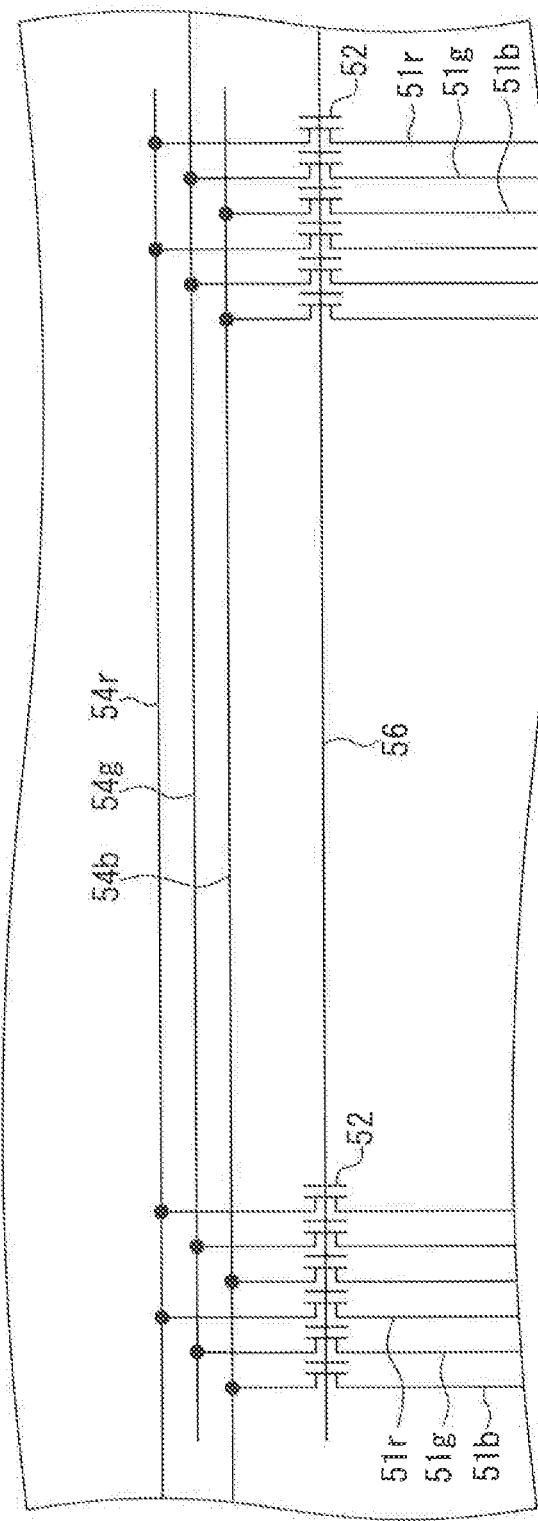
FIG. 15 is a diagram for describing configurations of main elements of the active matrix substrate shown in FIG. 13 in a section that is opposite from a portion on which a data driver is mounted.

FIG. 12 is a plan view for describing main elements of an active matrix substrate according to a third embodiment of the present invention. FIG. 13 is a diagram for describing configurations of main elements of the active matrix substrate shown in FIG. 12. FIG. 14 is a cross-sectional view taken along the line XIV-XIV of FIG. 13. FIG. 15 is a diagram for describing configurations of main elements of the active matrix substrate shown in FIG. 13 in a section that is opposite from a portion on which a data driver is mounted.

Referring to the figures, the present embodiment differs from the first embodiment described earlier mainly in that third thin-film transistors are provided to end portions of data bus lines that are not connected to mounting terminals, and also in that second common wires that are connected in common to the plurality of third thin-film transistors are provided. It should be noted that the elements that are common to the first embodiment described earlier are given the same reference numerals, and a redundant description thereof is omitted.

That is to say, first of all, on an active matrix substrate 5 according to the present embodiment shown in FIG. 12, mounting terminals DT3 or DT4 are connected to draw-out lines 22 in a mounting portion on which a data driver 16 is mounted (labeled "DA" in the figure). Second thin-film transistors (second switching elements) 45 are connected to the mounting terminals DT3 or DT4. All of the second thin-film transistors 45 are connected to one first common wire 47. The mounting portion is provided with a control line 46 for controlling an operation to turn on/off each of the plurality of second thin-film transistors 45.

In other words, the draw-out lines 22, the mounting terminals DT3 or DT4, the second thin-film transistors 45, later-described connection wires, and one first common wire 47 are sequentially connected to the data driver 16 (driver chip) side of data bus lines D on the active matrix substrate 5 according to the present embodiment. A terminal 49a is connected to the first common wire 47. The terminal 49a is also connected to an input terminal 49c via a wire 49b. The FPC connection terminals of the aforementioned FPC 8 are connected to the input terminal 49c. An inspection signal associated with the aforementioned inspection processing and voltage associated with the aforementioned voltage application processing for data bus lines D are input from the terminal 49a or the input terminal 49c. In a liquid crystal display apparatus 1 as a final product, the input terminal 49c is earthed via the aforementioned FPC 8.

As shown in FIG. 13, draw-out lines 22r, 22g, and 22b are provided, for example, in correspondence with the colors R, G, and B, respectively, similarly to the first embodiment. The draw-out lines 22r, 22g, and 22b are connected to the data bus lines D corresponding to R, G, and B, respectively. The aforementioned mounting terminal DT3 or DT4 and a second thin-film transistor 45a or 45b are sequentially connected to each of the draw-out lines 22r, 22g, 22b. The second thin-film transistors 45a or 45b are each connected to one of the aforementioned connection wires 50r, 50g, and 50b that are provided in correspondence with R, G, and B, respectively. A first common wire 47 is connected to the connection wires 50r, 50g, 50b via terminal contact holes H3. The connection wires 50r, 50g, 50b are formed from the same conductive layer as the data bus lines D (source layer), whereas the first common wire 47 is formed from the same conductive layer as gate bus lines G (gate layer).

Bumps (electrodes) of the data driver 16 are connected to the mounting terminals DT3, DT4, similarly to the first embodiment. It should be noted that, unlike the first embodiment, each of the mounting terminals DT3, DT4 is provided with an upper-layer terminal electrode that is connected to a bump (electrode) and formed from the same conductive layer as pixel electrodes 19, and two lower-layer terminal electrodes that are sequentially connected to the upper-layer terminal electrode and formed respectively from the same conductive layer as the data bus lines D and the same conductive layer as the gate bus lines G (not shown). The mounting terminals DT3 have the functions of the aforementioned cross-connection portions 70. At the mounting terminals DT3, first lower-layer terminal electrodes (draw-out lines 22) formed from the same conductive layer as the gate bus lines G are cross-connected to second lower-layer terminal electrodes (drain electrodes of the second thin-film transistors) formed from the same conductive layer as the data bus lines D so as to be connected to the second thin-film transistors 45. That is to say, the mounting terminals DT3 and DT4 have the same configurations as upper-layer terminal electrodes and lower-layer terminal electrodes of mounting terminals DT5 and DT6 according to a later-described fourth embodiment (see FIGS. 20 and 21).

The second thin-film transistors 45a, 45b are constructed similarly to the second thin-film transistor 23b shown in FIG. 10. That is to say, in the vicinity of a second thin-film transistor 45b shown in the example of FIG. 14, the control line 46, as well as a gate insulating film 29 that is formed so as to cover the control line 46, is provided on a base member 5a of the active matrix substrate 5. A gate electrode 45bg of the second thin-film transistor 45b is constructed integrally with the control line 46.

A semiconductor layer 45bh of the second thin-film transistor 45b and a channel protection layer 30 are sequentially layered above the gate insulating film 29. The semiconductor layer 45bh is constructed from, for example, an oxide semiconductor, similarly to semiconductor layers 18*h* of first thin-film transistors 18.

A drain electrode 45*bd* and a source electrode 45*bs* of the second thin-film transistor 45*b*, which are constructed integrally with the draw-out line 22*g* and the connection wire 50*g*, respectively, are provided on the semiconductor layer 45*bh*. An interlayer insulating film 31 and an interlayer insulating film 33 are sequentially layered on the drain electrode 45*bd*, the source electrode 45*bs*, and the channel protection layer 30.

As shown in FIG. 13, at the second thin-film transistors 45, rectangular metal electrodes 44 are provided in such a manner that four edges thereof surround the corresponding semiconductor layers 45*ah*, 45*bh* of the second thin-film transistors 45*a*, 45*b*.

Specifically, for example, at the second thin-film transistor 45*b* shown in FIG. 14, an electrode film CSa formed from the same conductive layer as the metal electrode 44 and an auxiliary capacitance electrode CS is provided between the interlayer insulating films 31 and 33. The metal electrode 44 is provided above the gate electrode 45*bg*, the semiconductor layer 45*bh*, the drain electrode 45*bd*, and the source electrode 45*bs* of the second thin-film transistor 45*b* so as to function as a light shielding film therefor. As shown in FIG. 14, the metal electrode (light shielding film) 44 is covered by the interlayer insulating film 33.

In order to inhibit the generation of a leak current, which will be described later, it is preferable to form the metal electrodes 44 so as to completely cover channel portions of the second thin-film transistors 45*a*, 45*b* when viewed from a direction perpendicular to a substrate surface of the active matrix substrate 5.

As shown in FIG. 12, the control line 46 controls an operation to turn on/off each of the plurality of second thin-film transistors 45, and a terminal 48*a* is connected to the control line 46 and also to an input terminal 48*c* via a wire 48*b*. The FPC connection terminals of the aforementioned FPC 8 are connected to the input terminal 48*c*. When performing the inspection processing and the voltage application processing, a control signal for performing an operation to turn on/off each of the second thin-film transistors 45 is input from the terminal 48*a* or the input terminal 48*c*. In the liquid crystal display apparatus 1 as a final product, a signal for turning off each of the second thin-film transistors 45 is input to the input terminal 48*c* via the aforementioned FPC 8.

As shown in FIG. 12, end portions of the data bus lines D that are not connected to the mounting terminals DT3 or DT4 are drawn out to the outside of an effective display region A by a plurality of draw-out lines 51. A third thin-film transistor 52 serving as a third switching element and a connection wire 53 are sequentially connected to each of the plurality of draw-out lines 51. Each of the plurality of connection wires 53 is connected to one of three second common wires 54.

A control line 56 controls operations to turn on/off the third thin-film transistors 52. That is to say, gate electrodes (not shown) of the third thin-film transistors 52 are constructed integrally with the control line 56. A terminal 57 is connected to the control line 56. The terminal 57 is also connected to an input terminal 58 via a wire. The FPC connection terminals of the aforementioned FPC 8 are connected to the input terminal 58. When performing the inspection processing and the voltage application processing, a control signal for performing operations to turn on/off the third thin-film transistors 52 is input from the terminal 57 or the input terminal 58. In the liquid crystal display apparatus 1 as a final product, a signal for turning off each of the third thin-film transistors 52 is input to the input terminal 58 via the aforementioned FPC 8.

The second common wires 54 are connected to corresponding terminals 55 via wires. For example, an inspection signal and voltage in inspection processing for the data bus lines D are supplied to the terminals 55.

Specifically, as shown in FIG. 15, on the active matrix substrate 5 according to the present embodiment, draw-out lines 51*r*, 51*g*, and 51*b* are provided, for example, in correspondence with the colors R, G, and B, respectively. The draw-out lines 51*r*, 51*g*, and 51*b* are connected to end portions of the data bus lines D corresponding to R, G, and B, respectively, at the non-input side. Drain electrodes, not shown, of the third thin-film transistors 52 are connected to the corresponding draw-out lines 51*r*, 51*g*, 51*b*. Source electrodes (not shown) of the third thin-film transistors 52 are each connected to one of the second common wires 54*r*, 54*g*, and 54*b*, which are provided in correspondence with the colors R, G, and B, respectively, via the connection wire 53 (FIG. 22). In other words, the second common wires 54*r*, 54*g*, and 54*b* are connected to the draw-out lines 51*r*, 51*g*, and 51*b* in correspondence with the colors R, G, and B, respectively, via the third thin-film transistors 52. Furthermore, a predetermined number of R, G, and B data bus lines D are connected to the second common wires 54*r*, 54*g*, and 54*b*, respectively. In this way, on the active matrix substrate 5 according to the present embodiment, an inspection operation for the data bus lines D can be performed for each of the colors R, G, B.

That is to say, on the active matrix substrate 5 according to the present embodiment, only one first common wire 47 is provided at the input side of the data bus lines D (i.e., in a section with a portion on which the aforementioned driver chip is mounted). Therefore, in an inspection operation using the first common wire 47, it is possible to detect disconnection of each of the data bus lines D and the draw-out lines 22, failures of first thin-film transistors 18, and the like. However, it is not possible to perform single-color display using R, G, or B and to detect a short circuit between neighboring data bus lines D or between neighboring draw-out lines 22 as in the first embodiment. In view of this, on the active matrix substrate 5 according to the present embodiment, the three second common wires 54*r*, 54*g*, and 54*b* are provided in correspondence with R, G, and B, respectively, at the non-input side of the data bus lines D. This enables single-color display using R, G, or B and detection of a short circuit between neighboring data bus lines D or between neighboring draw-out lines 22, similarly to the first embodiment. It should be noted that disconnection of the draw-out lines 22 cannot be detected in an inspection using the second common wires 54*r*, 54*g*, 54*b*. For this reason, it is preferable to carry out the inspection in combination with an inspection using the first common wire 47.

Similarly to the first embodiment, on the active matrix substrate 5 according to the present embodiment, voltage can be applied from the second common wires 54*r*, 54*g*, 54*b* at the time of alignment processing for a liquid crystal layer (voltage application processing for implementing the PSA technology), and a time period required for the alignment processing can be reduced by applying voltage simultaneously from the first common wire 47.

With the foregoing configurations, the present embodiment can achieve the functions and effects similar to those achieved by the first embodiment described earlier. In the present embodiment, the third thin-film transistors (third switching elements) 52 and the second common wires 54 are provided. The third thin-film transistors 52 are connected to end portions of the data bus lines D that are not connected to the mounting terminals DT3 or DT4, and the second common wires 54 are connected in common to the plurality of third thin-film transistors 52. Accordingly, in the present embodiment, the configurations in a section with the mounting terminals DT3 or DT4, such as the configuration of the aforementioned first common wire 47, can be simplified, and the second thin-film transistors (second switching elements) 45 can be installed more easily even if a region for mounting a driver is small. Furthermore, the present embodiment can downsize the region for mounting the driver. This makes it possible to further downsize the external shape of the active matrix substrate 5, and hence the external shape of the liquid crystal display apparatus 1. Furthermore, the resistance of auxiliary capacitance electrode driving signal wires CS1 for the auxiliary capacitance electrode (common electrode) CS can be reduced by increasing a region for installing the auxiliary capacitance electrode driving signal wires CS1, i.e., by thickening the auxiliary capacitance electrode driving signal wires CS1. As a result, the occurrence of defective display, such as flickering and shadowing, attributed to a delay in signals (voltage signals) to the auxiliary capacitance electrode CS can be inhibited.

Fourth Embodiment

Figure 16:
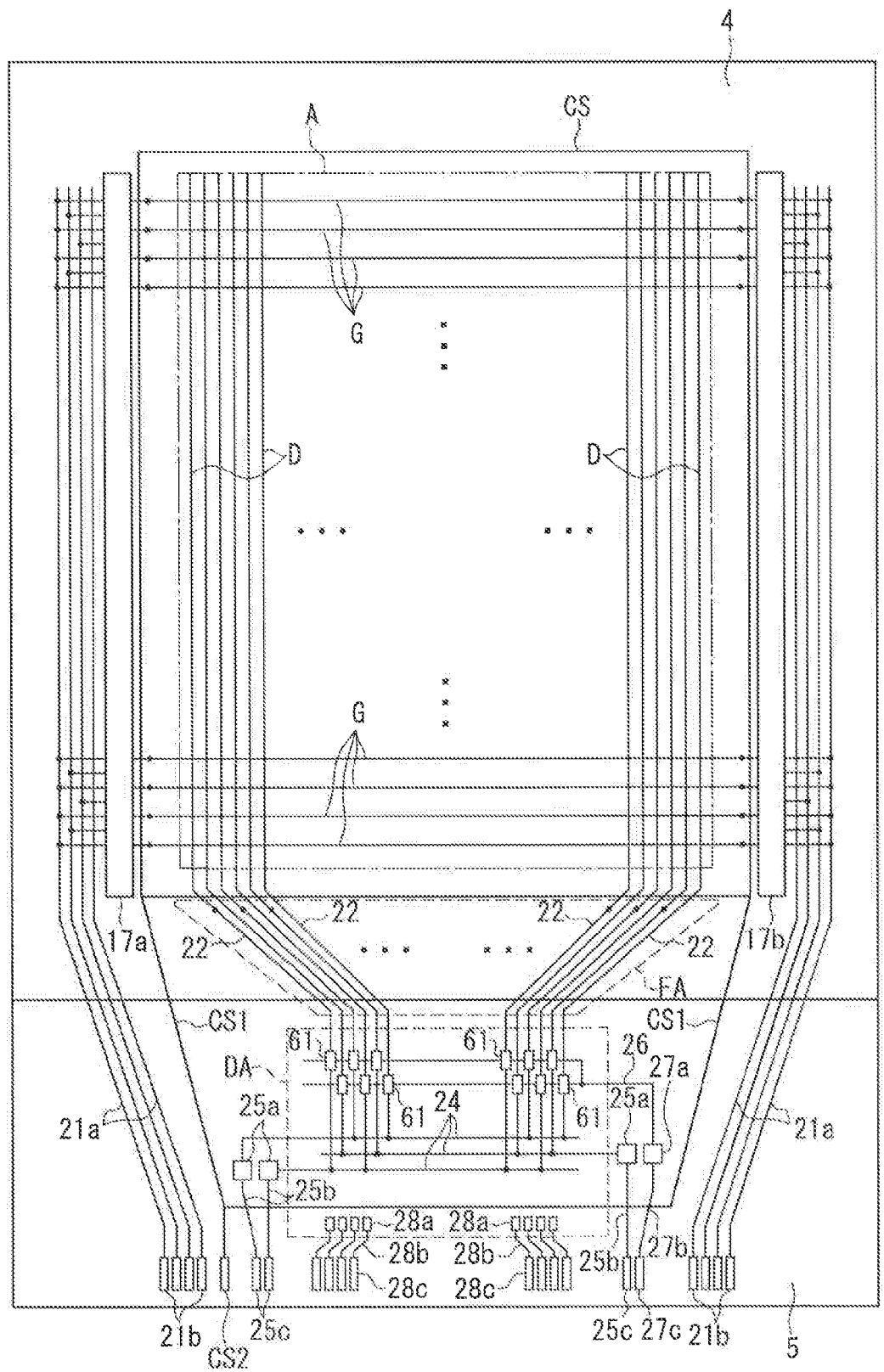
FIG. 16 is a plan view for describing main elements of an active matrix substrate according to a fourth embodiment of the present invention.
Figure 17:
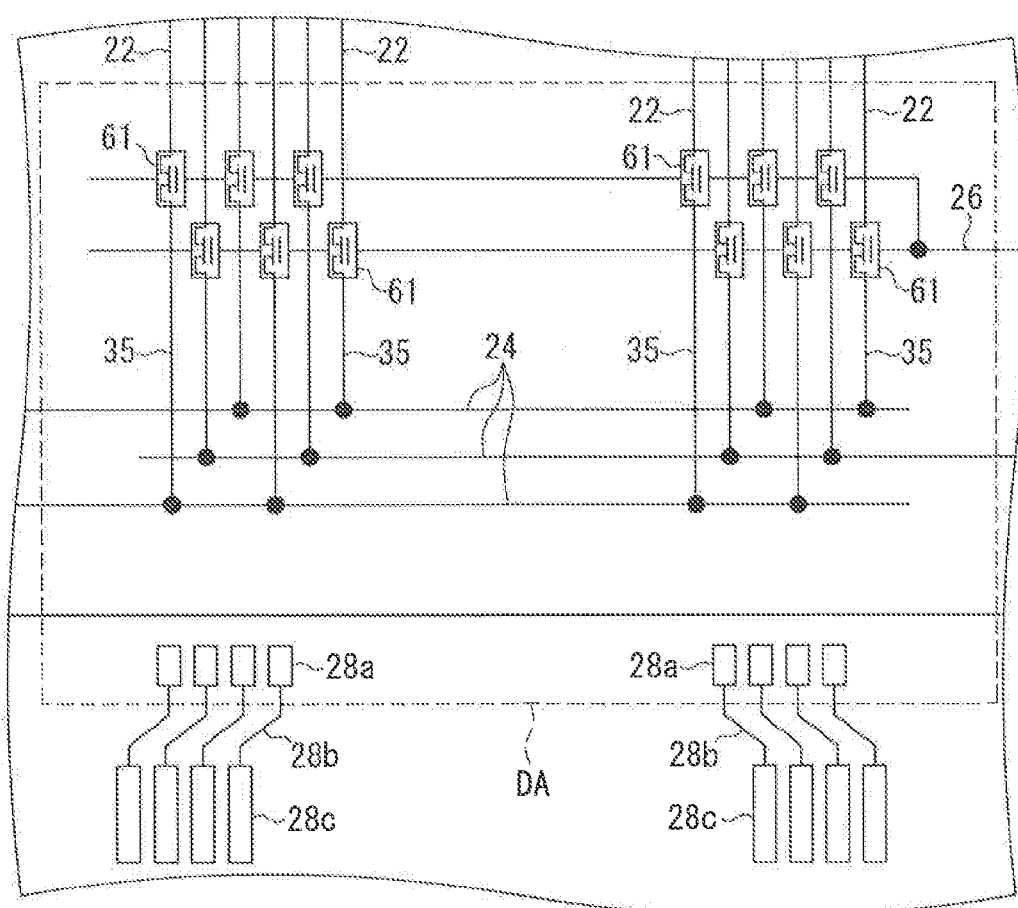
FIG. 17 is an enlarged plan view for describing a portion on which a data driver is mounted and the surroundings thereof shown in FIG. 16.
Figure 18:
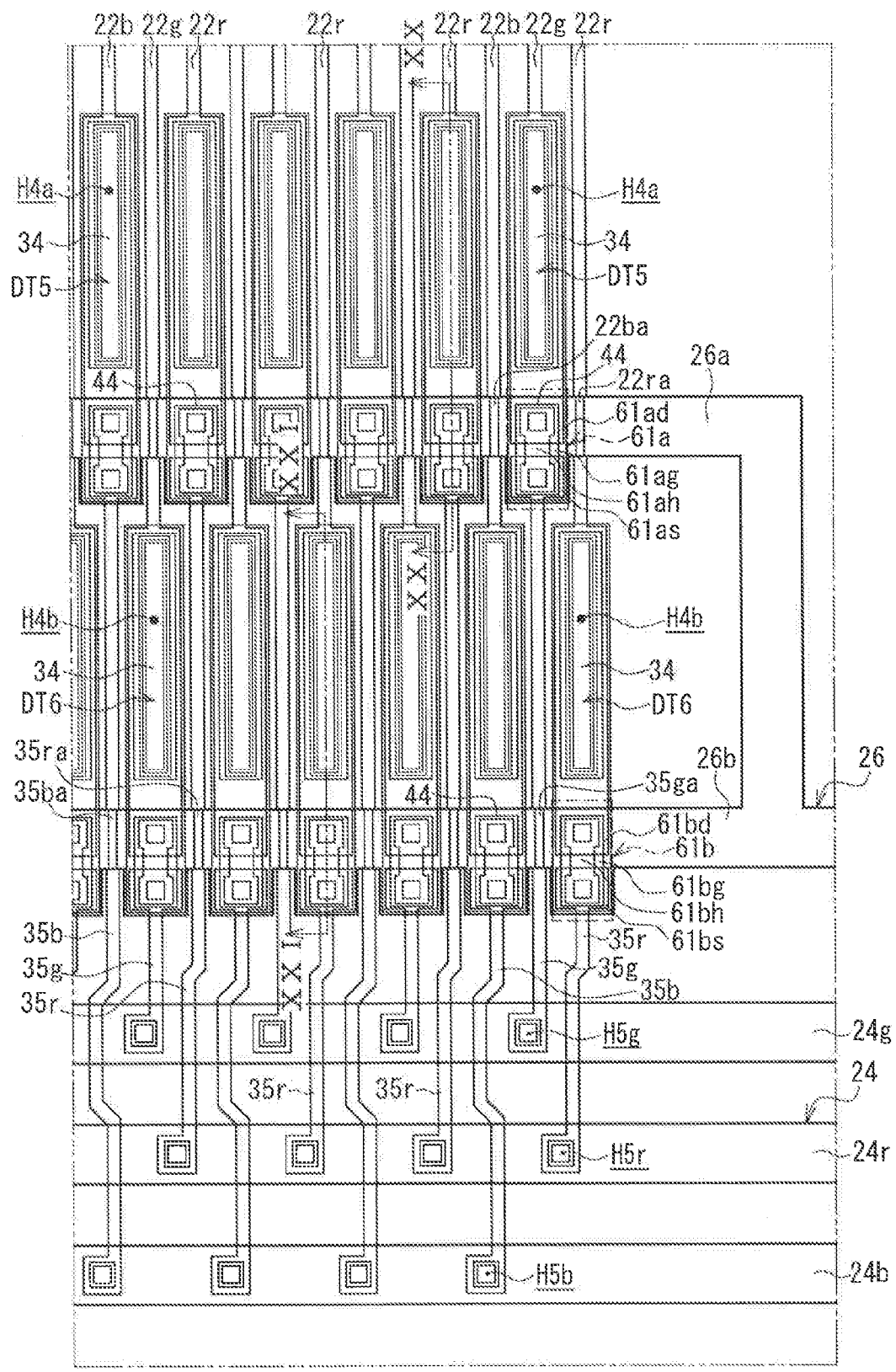
FIG. 18 is a diagram for describing configurations of main elements of the active matrix substrate shown in FIG. 16.
Figure 19:
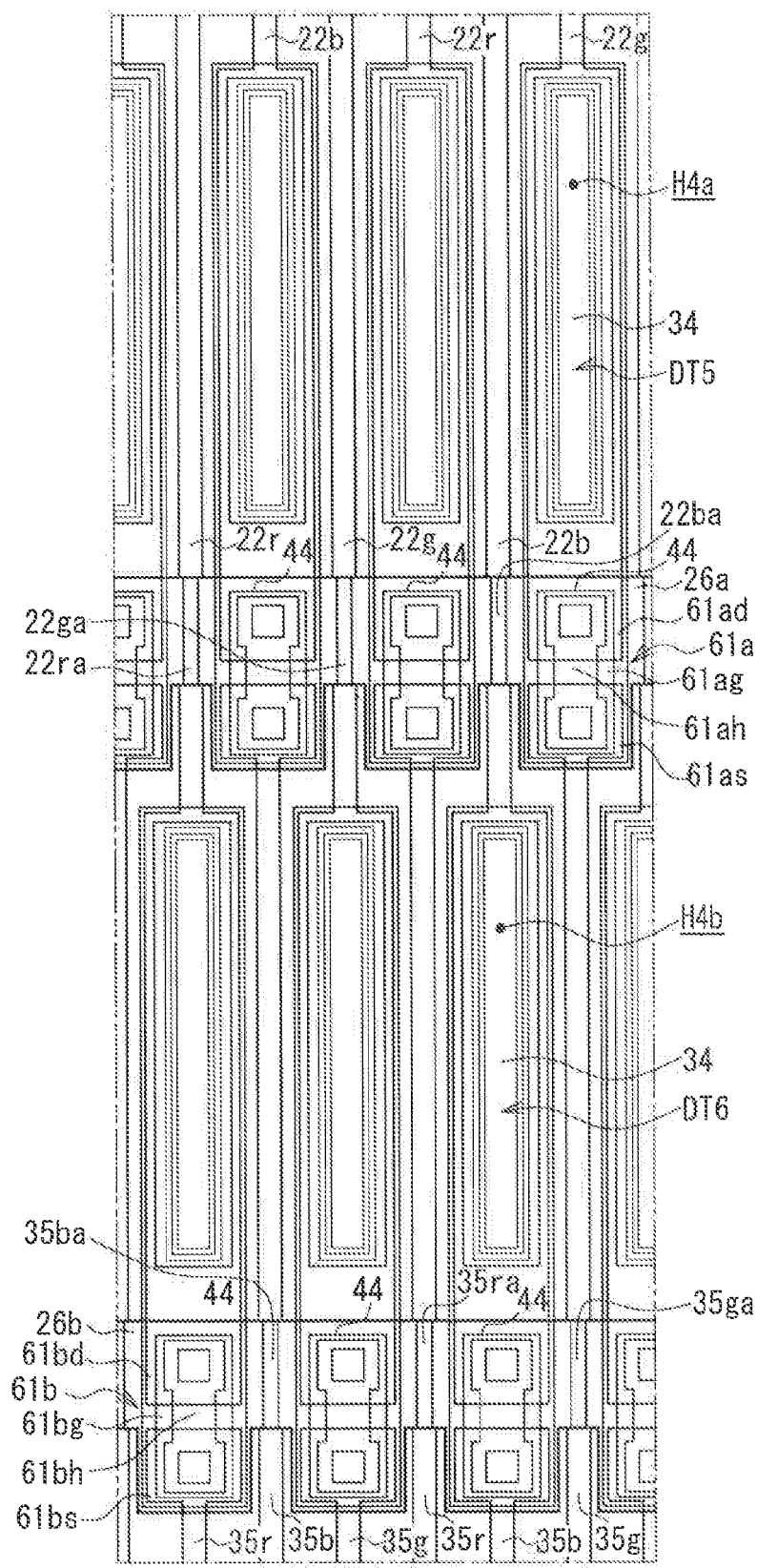
FIG. 19 is an enlarged plan view for describing mounting terminals, second thin-film transistors, and metal electrodes shown in FIG. 18.
Figure 20:
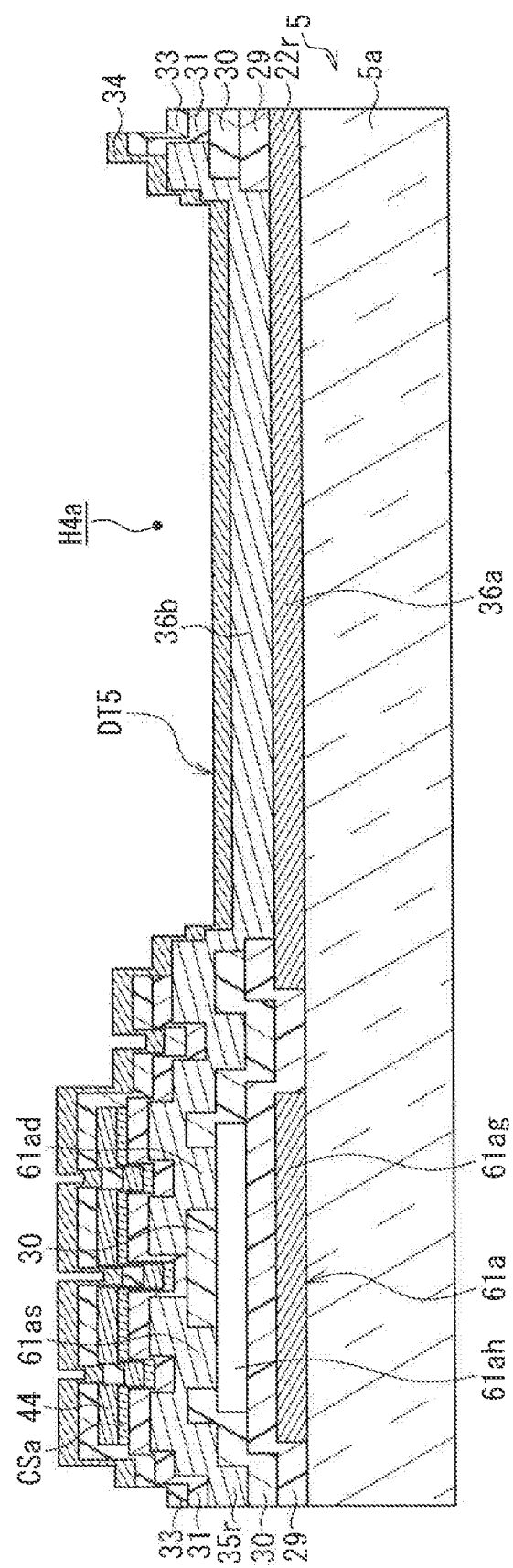
FIG. 20 is a cross-sectional view taken along the line XX-XX of FIG. 18.
Figure 21:
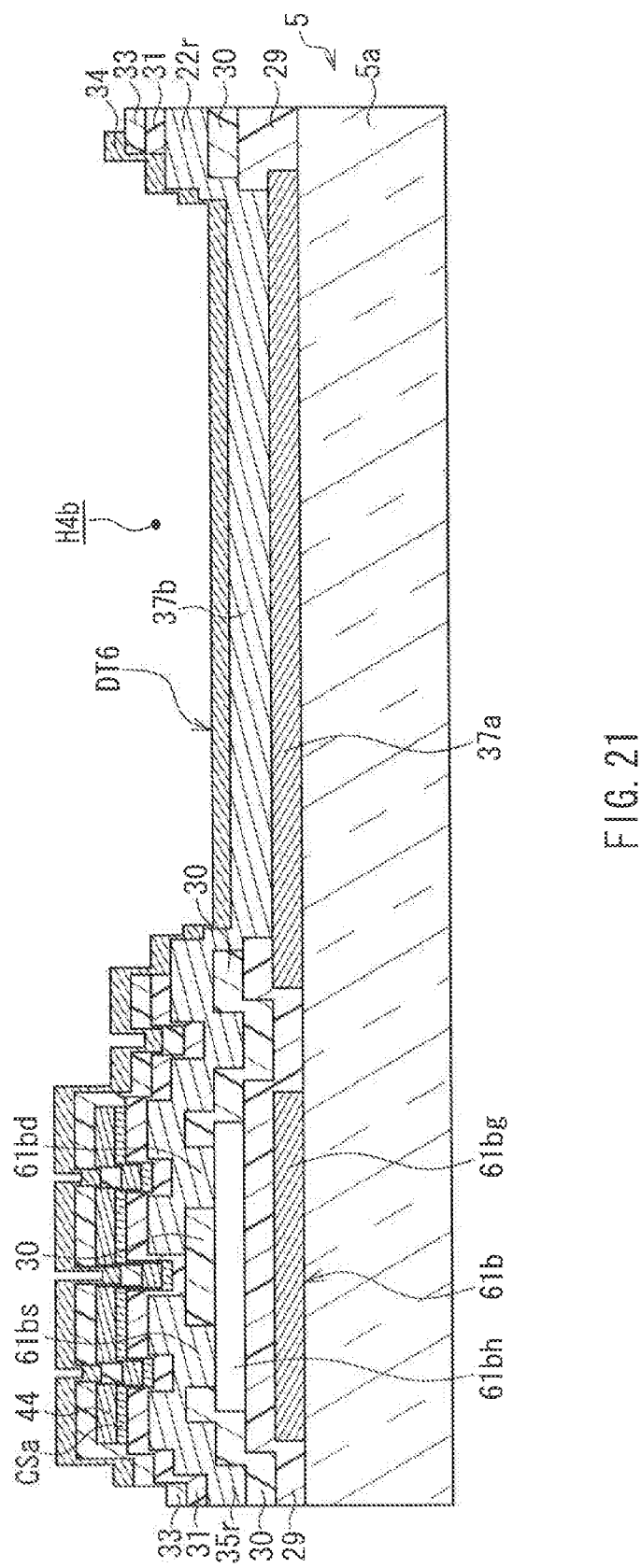
FIG. 21 is a cross-sectional view taken along the line XXI-XXI of FIG. 18.

FIG. 16 is a plan view for describing main elements of an active matrix substrate according to a fourth embodiment of the present invention. FIG. 17 is an enlarged plan view for describing a portion on which a data driver is mounted and the surroundings thereof shown in FIG. 16. FIG. 18 is a diagram for describing configurations of main elements of the active matrix substrate shown in FIG. 16. FIG. 19 is an enlarged plan view for describing mounting terminals, second thin-film transistors, and metal electrodes shown in FIG. 18. FIG. 20 is a cross-sectional view taken along the line XX-XX of FIG. 18. FIG. 21 is a cross-sectional view taken along the line XXI-XXI of FIG. 18.

Referring to the figures, the present embodiment differs from the first embodiment described earlier mainly in that second thin-film transistors are arranged between first common wires and terminal contact holes provided in corresponding mounting terminals, and also in that upper-layer terminal electrodes of the mounting terminals are provided so as to cover at least portions of the second thin-film transistors. It should be noted that the elements that are common to the first embodiment described earlier are given the same reference numerals, and a redundant description thereof is omitted.

That is to say, in FIGS. 16 and 17, a mounting portion on which a data driver 16 is mounted (labeled "DA" in the figures) is provided on an active matrix substrate 5 according to the present embodiment, and as will be described later in detail, mounting terminals DT5 or DT6 that are provided continuously with second thin-film transistors 61 serving as second switching elements are arranged on the mounting portion.

The aforementioned mounting portion is provided with the plurality of aforementioned second thin-film transistors 61, three first common wires 24, connection wires 35 that each connect one of the plurality of second thin-film transistors 61 and one of the three first common wires 24, and a control line 26 that controls an operation to turn on/off each of the plurality of second thin-film transistors 61. The second thin-film transistors 61, the first common wires 24, the connection wires 35, and the control line 26 are installed for the purpose of performing predetermined operation processing, e.g., inspection processing and countermeasures against static electricity with respect to each of a plurality of data bus lines D, or voltage application processing performed in alignment processing for liquid crystal molecules in the aforementioned liquid crystal layer.

As shown in FIGS. 18 and 19, on the active matrix substrate 5 according to the present embodiment, draw-out lines 22r, 22g, and 22b are provided, for example, in correspondence with the colors R, G, and B, respectively, similarly to the first embodiment. The draw-out lines 22r, 22g, and 22b are connected to the data bus lines D corresponding to R, G, and B, respectively. The aforementioned mounting terminals DT5 and DT6 are connected, respectively via terminal contact holes H4a and H4b, to the corresponding draw-out lines 22r, 22g, 22b. The second thin-film transistors 61a and 61b are connected to the mounting terminals DT5 and DT6, respectively. The second thin-film transistors 61a or 61b are each connected to one of connection wires 35r, 35g, and 35b that are provided in correspondence with R, G, and B, respectively. First common wires 24r, 24g, and 24b that are provided respectively in correspondence with R, G, and B, are connected to the connection wires 35r, 35g, and 35b via terminal contact holes H5r, H5g, and H5b, respectively. In this way, the data bus lines D corresponding to R, G, and B are connected respectively to the first common wires 24r, 24g, and 24b, and different inspection signals can be input and independent inspection operations can be performed in one-to-one relationship with the data bus lines D corresponding to R, G, and B.

As described above, on the active matrix substrate 5 according to the present embodiment, a predetermined number of data bus lines D corresponding to R, G, and B are connected to the first common wires 24r, 24g, and 24b, respectively, via a predetermined number of second thin-film transistors 61a or 61b, and an independent inspection operation can be performed for each of the R, G, and B data bus lines D, similarly to the first embodiment. Therefore, in an inspection where defects are visually detected, single-color display using R, G, or B can be performed. This makes it easy to detect leakages of the data bus lines D.

As shown in FIGS. 18 and 19, the second thin-film transistors 61a that are constructed continuously with the mounting terminals DT5 and the second thin-film transistors 61b that are constructed continuously with the mounting terminals DT6 are staggered in two rows (i.e., two neighboring mounting terminals DT5, DT6 are sequentially shifted so as to be arranged in different positions along a linear direction).

Among the draw-out lines 22r, 22g, 22b, one of two neighboring draw-out lines 22 is formed from the same conductive layer as gate bus lines G, whereas the other of the two neighboring draw-out lines 22 is formed from the same conductive layer as the data bus lines D (see FIGS. 20 and 21).

Specifically, in the example shown in FIG. 20, the draw-out line 22r is formed from the same conductive layer as the gate bus lines G on a base member 5a. Also, a gate electrode 61ag of the second thin-film transistor 61a is constructed on the base member 5a. This gate electrode 61ag is constructed integrally with a branch wire 26a (FIG. 18) of the aforementioned control line 26 that is formed from the same conductive layer as the gate bus lines G.

In FIG. 20, an end portion of the draw-out line 22r is used as a first lower-layer terminal electrode 36a of the mounting terminal DT5. This mounting terminal DT5 is provided with a second lower-layer terminal electrode 36b formed from the same conductive layer as the data bus lines D, and an upper-layer terminal electrode 34 formed from the same conductive layer as pixel electrodes 19. In this mounting terminal DT5, the first lower-layer terminal electrode 36a and the second lower-layer terminal electrode 36b are connected to each other, and the second lower-layer terminal electrode 36b and the upper-layer terminal electrode 34 are connected to each other, via the aforementioned terminal contact hole H4a formed in a gate insulating film 29, a channel protection layer 30, and interlayer insulating films 31 and 33.

The second lower-layer terminal electrode 36b is constructed integrally with a drain electrode 61ad of the second thin-film transistor 61a. A source electrode 61as of the second thin-film transistor 61a is formed from the same conductive layer as the data bus lines D, similarly to the drain electrode 61ad, and as shown in the example of FIG. 20, the source electrode 61as constitutes an end portion of the aforementioned connection wire 35r.

A semiconductor layer 61ah of the second thin-film transistor 61a is constructed from, for example, an oxide semiconductor, similarly to semiconductor layers 18h of first thin-film transistors 18.

The upper-layer terminal electrode 34 of the mounting terminal DT5 is formed so as to cover at least a portion of the second thin-film transistor 61a, and a bump (electrode) of the data driver 16 is connected to the upper-layer terminal electrode 34.

As shown in the example of FIG. 21, a third lower-layer terminal electrode 37a formed from the same conductive layer as the gate bus lines G is provided on the base member 5a. A gate electrode 61bg of the second thin-film transistor 61b is constructed on the base member 5a. This gate electrode 61bg is constructed integrally with a branch wire 26b (FIG. 18) of the aforementioned control line 26 that is formed from the same conductive layer as the gate bus lines G.

In FIG. 21, a portion (end portion) of the draw-out line 22r that is formed from the same conductive layer as the data bus lines D is used as a fourth lower-layer terminal electrode 37b of the mounting terminal DT6. This mounting terminal DT6 is provided with an upper-layer terminal electrode 34 that is formed from the same conductive layer as the pixel electrodes 19. In this mounting terminal DT6, the third lower-layer terminal electrode 37a and the fourth lower-layer terminal electrode 37b are connected to each other, and the fourth lower-layer terminal electrode 37b and the upper-layer terminal electrode 34 are connected to each other, via the aforementioned terminal contact hole H4b formed in the gate insulating film 29, the channel protection layer 30, and the interlayer insulating films 31 and 33.

The fourth lower-layer terminal electrode 37b is constructed integrally with a drain electrode 61bd of the second thin-film transistor 61b. A source electrode 61bs of the second thin-film transistor 61b is formed from the same conductive layer as the data bus lines D, similarly to the drain electrode 61bd, and as shown in the example of FIG. 21, the source electrode 61bs constitutes an end portion of the aforementioned connection wire 35r.

A semiconductor layer 61bh of the second thin-film transistor 61b is constructed from, for example, an oxide semiconductor, similarly to the semiconductor layers 18h of the first thin-film transistors 18.

The upper-layer terminal electrode 34 of the mounting terminal DT6 is formed so as to cover at least a portion of the second thin-film transistor 61b, and a bump (electrode) of the data driver 16 is connected to the upper-layer terminal electrode 34.

As shown in FIG. 18, narrow portions 22ra, 22ga, and 22ba with small widthwise dimensions are provided respectively in the draw-out lines 22r, 22g, and 22b at portions intersecting with the branch wire 26a of the control line 26.

Similarly, narrow portions 35ra, 35ga, and 35ba with small widthwise dimensions are provided respectively in the connection wires 35r, 35g, and 35b at portions intersecting with the branch wire 26b of the control line 26.

By thus providing the narrow portions 22ra, 22ga, 22ba and the narrow portions 35ra, 35ga, 35ba, the areas of intersections between the branch wire 26a and the draw-out lines 22r, 22g, 22b, as well as the areas of intersections between the branch wire 26b and the connection wires 35r, 35g, 35b, can be reduced. As a result, the active matrix substrate 5 according to the present embodiment can inhibit a signal delay in the data bus lines D, and prevent a decrease in the display quality after mounting a chip of the data driver 16 (i.e., the display quality of a liquid crystal display apparatus 1 as a final product). Furthermore, during the inspection, a delay in an inspection control signal for the control line 26 can be inhibited. Therefore, at the time of display for the inspection, unevenness in display can be easily reduced, and erroneous detection of defects can be inhibited.

In addition to the foregoing description, for example, the widthwise dimensions of the branch wires 26a, 26b of the control line 26 may be reduced so as to reduce the areas of intersections with the corresponding draw-out lines 22 and connection wires 35. That is to say, at the aforementioned intersecting portions, at least one of a group of the draw-out lines 22 and the connection wires 35 and a group of the branch wires 26a, 26b may be narrowed.

Furthermore, in FIG. 18, the second thin-film transistors 61a and 61b are in an off state in the liquid crystal display apparatus 1 as a final product. In this way, a decrease in the display quality (shadowing) can be prevented in the liquid crystal display apparatus 1 as a final product.

With the foregoing configurations, the present embodiment can achieve the functions and effects similar to those achieved by the first embodiment described earlier. In the present embodiment, each mounting terminal DT5 has the upper-layer terminal electrode 34, the first lower-layer terminal electrode 36a, and the second lower-layer terminal electrode 36b that are connected to one another via the terminal contact hole H4a. Each mounting terminal DT6 has the upper-layer terminal electrode 34, the third lower-layer terminal electrode 37a, and the fourth lower-layer terminal electrode 37b that are connected to one another via the terminal contact hole H4b. The second thin-film transistors (second switching elements) 61a are arranged between the first common wires 24 and the terminal contact holes H4a, whereas the second thin-film transistors (second switching element) 61b are arranged between the first common wires 24 and the terminal contact holes H4b. The upper-layer terminal electrodes 34 are provided so as to cover at least portions of the second thin-film transistors 61a or 61b. In this way, the area of connection between each upper-layer terminal electrode 34 and (a bump of) a driver chip of the data driver 16 is not reduced, and therefore the occurrence of defective connection can be inhibited. As a result, on the active matrix substrate 5 according to the present embodiment, the second thin-film transistors 61a and 61b can be easily installed even if a region for mounting the data driver 16 is small. As a region for installing the second thin-film transistors 61*a* and 61*b* can be downsized in the foregoing manner, it is possible to easily reduce the dimension of the external shape of the active matrix substrate 5, and hence the dimension of the external shape of the liquid crystal display apparatus 1.

In the present embodiment, each mounting terminal DT5 includes the first lower-layer terminal electrode 36*a* that is constituted by the end portion of the draw-out line formed from the same conductive layer as the gate bus lines G, and the second lower-layer terminal electrode 36*b* that is constructed integrally with the drain electrode 61*ad* of the second thin-film transistor 61*a* and is formed from the same conductive layer as the data bus lines D. In each terminal contact hole H4*a*, the first lower-layer terminal electrode 36*a* and the second lower-layer terminal electrode 36*b* are connected to each other. Accordingly, in the present embodiment, cross-connection between the draw-out lines 22 formed from the same conductive layer as the gate bus lines G and the drain electrodes 61*ad* of the second thin-film transistors 61*a* formed from the same conductive layer as the data bus lines D can be implemented at the terminal contact holes H4*a*. In this way, regions dedicated to such cross-connection (cross-connection portions 70) need not be provided, and the dimension of the external shape of the active matrix substrate 5 can be easily reduced.

In the present embodiment, each mounting terminal DT6 includes the third lower-layer terminal electrode 37*a* formed from the same conductive layer as the gate bus lines G, and the fourth lower-layer terminal electrode 37*b* that is constituted by the end portion of the draw-out line 22 formed from the same conductive layer as the data bus lines D and is constructed integrally with the drain electrode 61*bd* of the second thin-film transistor 61*b*. In each terminal contact hole H4*b*, the third lower-layer terminal electrode 37*a* and the fourth lower-layer terminal electrode 37*b* are connected to each other. Accordingly, in the present embodiment, all of the mounting terminals DT5 and DT6 can be constructed in the same manner regardless of the configuration of the draw-out lines 22, and an inspection for the state of the data driver (driver) 16 mounted on the mounting terminals DT5 and DT6 can be easily carried out.

Specifically, while the connection between the driver chip of the data driver 16 and the mounting terminals DT5 or DT6 is established via an anisotropic conductive film (ACF), there are cases in which an inspection for impression of conductive particles included in a conductive layer of the ACF is carried out as a contact inspection after mounting the driver chip. This inspection for impression is intended to measure the number of conductive particles between (bumps of) the driver chip and the mounting terminals DT5 or DT6 by observing the shapes of recesses and projections that are formed on the mounting terminals DT5 or DT6 by conductive particles from a back surface of the active matrix substrate 5. If the mounting terminals DT5 and DT6 have different film structures, a problem could possibly arise where the criteria of determination therefor become complicated. However, in the present embodiment, the mounting terminals DT5 and DT6 have the same film structure, and hence the occurrence of such a problem can be prevented.

In addition to the foregoing description, each mounting terminal DT5 or DT6 may be provided with a plurality of terminal contact holes.

Specifically, each mounting terminal DT5 or DT6 may be provided with, for example, two terminal contact holes. In this case, defective contact between the mounting terminals DT5 or DT6 and the data driver 16 can be easily reduced. Providing two terminal contact holes makes it possible to reduce the difference between the level of a portion of each upper-layer terminal electrode 34 provided with the mounting terminal DT5 or DT6 and the level of a portion of the upper-layer terminal electrode 34 covering the second thin-film transistor 61*a* or 61*b* compared to the fourth embodiment. Accordingly, defective contact in mounting the bumps (electrodes) of the driver chip of the data driver 16 can be reduced. It should be noted that, in the mounting terminals DT5, DT6 according to the fourth embodiment, defective formation of their terminal contact holes H4*a*, H4*b* can be reduced as the areas of the terminal contact holes H4*a*, H4*b* are large.

It should be noted that the embodiments described earlier are all illustrative and not restrictive. The technical scope of the present invention is defined by the claims, and all changes that come within the range of equivalency of the configurations described in the claims are to be embraced within the technical scope of the present invention.

For example, although the present invention is applied to a transmissive liquid crystal display apparatus in the foregoing description, an active matrix substrate of the present invention is not limited in this way. An active matrix substrate of the present invention can be applied to any display apparatus that includes an effective display region having a plurality of pixels and wires that transmit signals for driving the pixels. For example, the present invention can be adapted into an organic EL display, a microcapsule-type electrophoretic display apparatus, and other display apparatuses. A microcapsule-type electrophoretic display apparatus can display an image by, for example, applying voltage to a microcapsule layer formed in an effective display region on a pixel-by-pixel basis. A display apparatus can include, for example, a substrate provided with wires for an effective display region that are connected, via switching elements, to pixel electrodes provided in one-to-one relationship with pixels, and draw-out lines connected to the wires for the effective display region. This substrate, for example, can be constructed similarly to active matrix substrates according to the embodiments described earlier. Furthermore, an active matrix substrate of the present invention can be applied not only to such a display apparatus, but also to various types of sensor substrates, such as a sensor substrate for an X-ray detection apparatus.

Furthermore, although data bus lines D are provided on gate bus lines G via a gate insulating film (an insulating film) 29 in the foregoing description, it is sufficient that the gate bus lines G and the data bus lines D be provided in different layers via the insulating film on an active matrix substrate of the present invention. The gate bus lines G may be provided on the data bus lines D via the insulating film.

Furthermore, although mounting terminals DT are staggered in two rows in the foregoing description, an active matrix substrate of the present invention is not limited in this way. For example, mounting terminals DT may be staggered in three rows (i.e., three neighboring mounting terminals DT may be sequentially shifted so as to be arranged in different positions along a linear direction).

Furthermore, although the foregoing description involves application to a liquid crystal panel of a CPA mode, which is one type of a homeotropic alignment mode (what is called a liquid crystal panel of a vertical electric field), an active matrix substrate of the present invention is not limited in this way, and can also be applied, for example, to other liquid crystal panels of a homeotropic alignment mode using fishbone-type pixel electrodes, and to liquid crystal panels of a homogeneous alignment mode (what is called liquid crystal panels of a horizontal electric field).

Specifically, given an azimuth system where positive angles are taken counterclockwise starting from 0° pointing at the right side of a horizontal direction (the direction in which gate bus lines extend), a fishbone-type pixel electrode includes a plurality of elongated electrode portions (branch portions) that extend in the angles of, for example, 45°, 135°, 225°, and 315°. Between the elongated electrode portions, an elongated cutout (slit) extending in a corresponding direction is provided. A fishbone-type pixel electrode also includes a backbone portion (stem portion) that is located at a central portion of a pixel and extends along a vertical direction (the direction in which data bus lines extend). Each elongated electrode portion is connected to the backbone portion.

The direction in which the elongated electrode portions (or slits) extend varies with each of four regions that are obtained by dividing a pixel P into quarters, i.e., into two regions in both vertical and horizontal directions. As a result, at the time of voltage application, four liquid crystal alignment regions corresponding to the four regions (liquid crystal alignments in four domains) are formed within one pixel P. Within a liquid crystal domain, the alignment states of liquid crystal molecules are substantially the same. Different domains show different alignment states of liquid crystal molecules.

More specifically, when voltage is applied between a fishbone-type pixel electrode and a counter electrode 20, in each domain, liquid crystal molecules are aligned so as to be inclined parallel to the direction in which the slits extend, with their upper end portions facing the inner side of a pixel P.

In a homeotropic alignment mode using fishbone-type pixel electrodes, objects for alignment control for a counter substrate 4, such as alignment control protrusions CT, are not essential.

Furthermore, it is preferable to implement a homeotropic alignment mode using fishbone-type pixel electrodes in conjunction with the aforementioned polymer sustained alignment (PSA) technology, similarly to a CPA mode.

In a liquid crystal panel of a homogeneous alignment mode, homogeneous alignment films are provided on the inner surfaces of an active matrix substrate 5 and a counter substrate 4, and a liquid crystal layer uses liquid crystals with positive dielectric constant anisotropy. An auxiliary capacitance electrode serving as a common electrode is also used as a counter electrode. In the liquid crystal panel of the homogeneous alignment mode, the alignment of liquid crystals is controlled by forming a plurality of parallel slits (having a width of, for example, 2 μm to 4 μm) in pixel electrodes and generating a horizontal electric field between the pixel electrodes and the aforementioned counter electrode (common electrode). In the homogeneous alignment mode, it is not necessary to form the counter electrode 20 in the counter substrate 4. Furthermore, in the homogeneous alignment mode, the counter electrode serving as the common electrode is made from transparent electrode material and is provided below the pixel electrodes, similarly to the auxiliary capacitance electrode. Moreover, in the homogeneous alignment mode, there is a case in which the counter electrode serving as the common electrode is provided above the pixel electrodes, unlike the auxiliary capacitance electrode. In this case, the aforementioned slits are not formed in the pixel electrodes, and a plurality of parallel slits (having a width of, for example, 2 μm to 4 μm) are formed in the counter electrode.

Although upper-layer terminal electrodes 34, 43, or 60 of mounting terminals DT are formed from the same conductive layer as pixel electrodes 19 in the foregoing description, an active matrix substrate of the present invention is not limited in this way. Upper-layer terminal electrodes and pixel electrodes may be formed from different conductive layers. For example, in a liquid crystal panel of a homogeneous alignment mode, when a counter electrode serving as a common electrode is provided above pixel electrodes, upper-layer terminal electrodes may be formed in the same layer as the counter electrode. It is also possible to form the upper-layer terminal electrodes by newly adding a conductive layer different from the pixel electrodes and the counter electrode.

However, it is preferable to form the upper-layer terminal electrodes and the pixel electrodes from the same conductive layer, as in the embodiments described earlier. In this way, an active matrix substrate with a simple configuration can be easily constructed in simple manufacturing processes.

In the first to fourth embodiments described earlier, gate drivers are monolithically formed on an active matrix substrate. However, an active matrix substrate of the present invention is not limited in this way. For example, a driver chip (driver IC) into which a gate driver and a data driver are integrated may be mounted on an active matrix substrate.

In the foregoing description, second thin-film transistors (second switching elements) are provided between data bus lines and a data driver, and light shielding films formed from metal electrodes shield the second switching elements from light. However, an active matrix substrate of the present invention is not limited in this way. Second switching elements may be provided between gate bus lines and a gate driver, and light shielding films formed from metal electrodes may shield such second switching elements from light.

In the foregoing description, data bus lines are provided for pixels that each correspond to one of the colors red (R), green (G), and blue (B). However, an active matrix substrate of the present invention is not limited in this way. For example, R, G, and B pixels may be sequentially provided with respect to one data bus line.

Although data bus lines are provided for pixels that each correspond to one of three colors in the foregoing description, four or more colors (e.g., R, G, B, and yellow, or R, G, B, and white) may be used.

Although thin-film transistors are used as first to third switching elements in the foregoing description, switching elements of the present invention are not limited in this way. For example, other field-effect transistors may be used.

In addition to the foregoing description, the first to fourth embodiments described earlier may be combined as appropriate.

INDUSTRIAL APPLICABILITY

The present invention is useful for a low-cost active matrix substrate that can easily protect second switching elements without expanding the manufacturing processes, and also for a display apparatus incorporating such an active matrix substrate.

DESCRIPTION OF REFERENCE NUMERALS

1: liquid crystal display apparatus (display apparatus)
5: active matrix substrate
5*a*: base member
16: data driver
17, 17*a*, 17*b*: gate driver
18: first thin-film transistor (first switching element)

18d: drain electrode
18s: source electrode
18g: gate electrode
18h: semiconductor layer
19: pixel electrode
22, 22r, 22g, 22b: draw-out line
23, 23r, 23g, 23b, 45, 45a, 45b, 61, 61a, 61b: second thin-film transistor (second switching element)
23ad, 23bd, 45ad, 45bd, 61ad, 61bd: drain electrode
23as, 23bs, 45as, 45bs, 61as, 61bs: source electrode
23ag, 23bg, 45ag, 45bg, 61ag, 61bg: gate electrode
23ah, 23bh, 45ah, 45bh, 61ah, 61bh: semiconductor layer
24, 24r, 24g, 24b, 47: first common wire
29: gate insulating film (insulating film)
31, 32, 33: interlayer insulating film
34: upper-layer terminal electrode
36a: lower-layer terminal electrode (first lower-layer terminal electrode)
36b: lower-layer terminal electrode (second lower-layer terminal electrode)
37a: lower-layer terminal electrode (third lower-layer terminal electrode)
37b: lower-layer terminal electrode (fourth lower-layer terminal electrode)
44: metal electrode (light shielding film)
52: third thin-film transistor (third switching element)
54, 54r, 54g, 54b: second common wire
G, G1 to GN: gate bus line
D, D1 to DM: data bus line
A: effective display region
FA: fan-out portion
DT1 to DT6: mounting terminal
H4a, H4b: terminal contact hole
CS: auxiliary capacitance electrode (common electrode)
CSa: electrode film

The invention claimed is:

1. A display apparatus, comprising:
a counter substrate; and
an active matrix substrate, including:
 a base member;
 a gate bus line provided on the base member;
 a data bus line provided in a layer different from a layer that includes the gate bus line, an insulating film being provided between the layer including the data bus line and the layer including the gate bus line;
 a first switching element connected to the gate bus line and the data bus line;
 an interlayer insulating film provided so as to cover the first switching element, the interlayer insulating film having at least one layer;
 a pixel electrode connected to the first switching element;
 a common electrode that is made from transparent electrode material and is provided above or below the pixel electrode;
 a mounting terminal that supplies an output signal from a driver to the gate bus line or the data bus line;
 a draw-out line connecting the mounting terminal and the gate bus line or the data bus line;
 a plurality of second switching elements that are each connected to a corresponding one of a plurality of draw-out lines constituting the draw-out line; and
 a first common wire connected in common to the plurality of second switching elements, wherein
a metal electrode is provided above or below the pixel electrode,
at least a portion of each of the plurality of second switching elements is covered by a light shielding film formed from the metal electrode, and
the light shielding film is covered by at least one of the interlayer insulating film and the common electrode.

2. The display apparatus according to claim 1, wherein each of the plurality of second switching elements is arranged outside an effective display region in which a plurality of gate bus lines constituting the gate bus line and a plurality of data bus lines constituting the data bus line are arranged in a matrix pattern, and in which a plurality of pixel electrodes constituting the pixel electrode are arranged in a matrix pattern.

3. The display apparatus according to claim 1, wherein the metal electrode is provided in a layer above or below the common electrode so as to be in direct contact with the common electrode.

4. The display apparatus according to claim 1, further comprising:
a third switching element connected to an end portion of the gate bus line or the data bus line to which the mounting terminal is not connected; and
a second common wire connected in common to a plurality of third switching elements which define the third switching element.

5. The display apparatus according to claim 4, wherein the second common wire is defined by a plurality of second common wires, and
a predetermined number of the third switching elements are connected to each of the plurality of second common wires.

6. The display apparatus according to claim 1, wherein the first common wire is defined by a plurality of first common wires, and
a predetermined number of the second switching elements are connected to each of the plurality of first common wires.

7. The display apparatus according to claim 1, wherein among the plurality of draw-out lines, one of two neighboring draw-out lines is made from the same conductive layer as the gate bus line, and
the other of the two neighboring draw-out lines is made from the same conductive layer as the data bus line.

8. The display apparatus according to claim 7, wherein the first common wire is defined by a plurality of first common wires,
two of the second switching elements that are connected respectively to two neighboring draw-out lines among the draw-out lines made from the same conductive layer as the gate bus line are each connected to a different one of the first common wires, and
two of the second switching elements that are connected respectively to two neighboring draw-out lines among the draw-out lines formed from the same conductive layer as the data bus line are each connected to a different one of the first common wires.

9. The display apparatus according to claim 1, wherein the active matrix substrate further includes a driving terminal that supplies an input signal to the driver;
the draw-out lines include a fan-out portion that is arranged at an angle with respect to a direction of arrangement of the gate bus line or the data bus line, and
at least a portion of the first common wire and at least a portion of the second switching elements are arranged between the fan-out portion and the mounting terminal.

10. The display apparatus according to claim 9, wherein the second switching elements are not covered by the counter substrate.

11. The display apparatus according to claim 9, further comprising:
a driver chip, wherein the second switching elements are not covered by the driver chip.

12. The display apparatus according to claim 1, wherein
in the mounting terminal, an upper-layer terminal electrode and a lower-layer terminal electrode are connected via a terminal contact hole that is provided in at least one layer in the interlayer insulating film, the lower-layer terminal electrode being made from at least one of the same conductive layer as the gate bus line and the same conductive layer as the data bus line,
each of the plurality of second switching elements is arranged between the first common wire and the terminal contact hole, and
the upper-layer terminal electrode is provided so as to cover at least a portion of each of the plurality of second switching elements.

13. The display apparatus according to claim 12, wherein the mounting terminal includes:
a first lower-layer terminal electrode defined by an end portion of a draw-out line made from the same conductive layer as the gate bus line; and
a second lower-layer terminal electrode that is provided integrally with an electrode of the second switching elements and is made from the same conductive layer as the data bus line, and
the first and second lower-layer terminal electrodes are connected to each other at the terminal contact hole.

14. The display apparatus according to claim 12, wherein the mounting terminal includes:
a third lower-layer terminal electrode made from the same conductive layer as the gate bus line; and
a fourth lower-layer terminal electrode that is defined by an end portion of a draw-out line made from the same conductive layer as the data bus line and is provided integrally with an electrode of the second switching elements, and
the third and fourth lower-layer terminal electrodes are connected to each other at the terminal contact hole.

15. The display apparatus according to claim 12, wherein the upper-layer terminal electrode is made from the same conductive layer as the pixel electrode.

16. The display apparatus according to claim 1, wherein an oxide semiconductor is used for both the first and second switching elements.

* * * * *